United States Patent
Yen et al.

(10) Patent No.: US 10,418,392 B2
(45) Date of Patent: Sep. 17, 2019

(54) IMAGE SENSOR AND MANUFACTURING METHOD THEREOF

(71) Applicant: INDUSTRIAL TECHNOLOGY RESEARCH INSTITUTE, Hsinchu (TW)

(72) Inventors: Pei-Wen Yen, New Taipei (TW); Yan-Rung Lin, Hsinchu (TW); Kai-Ping Chuang, Zhubei (TW); Sheng-Min Yu, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/015,307

(22) Filed: Jun. 22, 2018

(65) Prior Publication Data

US 2018/0301485 A1  Oct. 18, 2018

Related U.S. Application Data

(60) Division of application No. 15/394,712, filed on Dec. 29, 2016, now Pat. No. 10,038,019, which is a (Continued)

(30) Foreign Application Priority Data

Dec. 29, 2015  (TW) .............................. 104144278 A
Nov. 18, 2016  (TW) .............................. 105137886 A

(51) Int. Cl.
H01L 27/146  (2006.01)

(52) U.S. Cl.
CPC .... H01L 27/14609 (2013.01); H01L 27/1463 (2013.01); H01L 27/14636 (2013.01); H01L 27/14683 (2013.01)

(58) Field of Classification Search
None
See application file for complete search history.

(56) References Cited

U.S. PATENT DOCUMENTS

| 5,451,769 A | 9/1995 | McAdoo et al. |
| 8,102,693 B2 | 1/2012 | Sargent et al. |

(Continued)

FOREIGN PATENT DOCUMENTS

| CN | 105428384 A | 3/2016 |
| TW | 200843093 A | 11/2008 |

(Continued)

OTHER PUBLICATIONS

Yunlong Guo et al., "Air-Stable and Solution-Processable Perovskite Photodetectors for Solar-Blind UV and Visible Light", The Journal of Physical Chemistry Letters, pp. 535-539, Jan. 2015.

(Continued)

Primary Examiner — Jay C Chang
(74) Attorney, Agent, or Firm — Rabin & Berdo, P.C.

(57) ABSTRACT

An image sensor and a manufacturing method thereof are provided. The image sensor includes a pixel sensing circuit, a pixel electrode, and an opto-electrical conversion layer. The pixel sensing circuit is corresponding to a plurality of pixel regions. The pixel electrode is disposed on the pixel sensing circuit. The pixel electrode includes a first electrode and a second electrode and is electrically connected to the pixel sensing circuit. The first electrode and the second electrode are coplanar, and have different polarities. The opto-electrical conversion layer is disposed on the pixel sensing circuit. The opto-electrical conversion layer includes a plurality of opto-electrical conversion portions, each of the opto-electrical conversion portions is corre- (Continued)

sponding to each of the pixel regions, and the opto-electrical conversion portions are separated from each other by a pixel isolation trench.

4 Claims, 18 Drawing Sheets

Related U.S. Application Data continuation-in-part of application No. 14/983,445, filed on Dec. 29, 2015, now Pat. No. 10,038,033.

(56) References Cited

U.S. PATENT DOCUMENTS

| | | | |
|---|---|---|---|
| 8,232,616 | B2 | 7/2012 | Maehara et al. |
| 8,779,413 | B1 | 7/2014 | Landry |
| 8,822,897 | B2 | 9/2014 | Tian et al. |
| 9,209,331 | B2 | 12/2015 | Ivanov et al. |
| 9,293,487 | B2 | 3/2016 | Tian et al. |
| 9,343,492 | B2 | 5/2016 | Jin et al. |
| 9,343,502 | B2 | 5/2016 | Kim et al. |
| 2001/0030279 | A1 | 10/2001 | Zhang et al. |
| 2007/0075253 | A1 | 4/2007 | Misawa et al. |
| 2007/0076093 | A1* | 4/2007 | Misawa ............ H01L 27/14632 348/125 |
| 2009/0127599 | A1 | 5/2009 | Kim et al. |
| 2009/0322923 | A1 | 12/2009 | Maehara |
| 2010/0060769 | A1 | 3/2010 | Inuiya |
| 2011/0025899 | A1 | 2/2011 | Schmaelzle et al. |
| 2011/0277818 | A1 | 11/2011 | Shimura |
| 2012/0032168 | A1 | 2/2012 | Cho et al. |
| 2015/0187844 | A1 | 7/2015 | Lee et al. |
| 2016/0035917 | A1 | 2/2016 | Gershon et al. |
| 2017/0186788 | A1 | 6/2017 | Yen et al. |
| 2017/0186818 | A1 | 6/2017 | Yen et al. |

FOREIGN PATENT DOCUMENTS

| | | |
|---|---|---|
| TW | 201212215 A | 3/2012 |
| TW | 201405790 A | 2/2014 |
| TW | 201405791 A | 2/2014 |
| TW | 201507186 A | 2/2015 |
| TW | 201508937 A | 3/2015 |
| TW | 201515201 A | 4/2015 |
| TW | 201532255 A | 8/2015 |
| TW | 201603307 A | 1/2016 |

OTHER PUBLICATIONS

U.S. Office Action dated May 18, 2017 corresponding to U.S. Appl. No. 14/983,445.
U.S. Office Action dated Sep. 27, 2017 corresponding to U.S. Appl. No. 14/983,445.
Taiwan Office Action dated Sep. 5, 2017.
Taiwanese Office Action dated Jan. 26, 2018.
Ray Fontaine, "The State-of-the-Art of Mainstream CMOS Image Sensors" (2015).
Qi Chen et al., "Under the spotlight: The organic-inorganic hybrid halide perovskite for optoelectronic applications", Nano Today, vol. 10, pp. 355-396, 2015.
Zhenkun Gu et al., "Direct-Writing Multifunctional Perovskite Single Crystal Arrays by Inkjet Printing", Advanced Science News, Small, vol. 13, pp. 1-7, Dec. 12, 2017.
Aashir Waleed et al., "Lead-Free Perovskite Nanowire Array Photodetectors with Drastically Improved Stability in Nanoengineering Templates", Nano Letters, vol. 17, pp. 523-530, Dec. 23, 2016.
Gongming Wang et al., "Wafer-scale growth of large arrays of perovskite microplate crystals for functional electronics and opto-electronics", Science Advances, vol. 1, pp. 1-8, Oct. 2, 2015.
Stanley S. Chou et al., "Laser Direct Write Synthesis of Lead Halide Perovskites", The Journal of Physical Chemistry Letters, vol. 7, pp. 3736-3741, Sep. 5, 2016.
Qi Chen et al., "Controllable Self-Induced Passivation of Hybrid Lead Iodide Perovskites toward High Performance Solar Cells", Nano Letters, vol. 14, pp. 4158-4163, Jun. 24, 2014.

* cited by examiner

IMAGE SENSOR AND MANUFACTURING METHOD THEREOF

This application is a divisional application of co-pending application Ser. No. 15/394,712, filed on Dec. 29, 2016, which is a continuation-in-part application of application Ser. No. 14/983,445, filed on Dec. 29, 2015. The prior application Ser. No. 15/394,712 claims the benefit of Taiwan application No. 104144278, filed on Dec. 29, 2015, and the benefit of Taiwan application Serial No. 105137886, filed on Nov. 18, 2016. The subject matters of which are incorporated herein by reference.

TECHNICAL FIELD

The present disclosure relates to an image sensor and a manufacturing method thereof.

BACKGROUND

In years, researchers in related fields have been emphasizing on developing highly photo-sensitive sensing components, in order to provide CMOS image sensors having sensitive performance under dark light environments.

However, photo sensing components are usually made of silicon materials, and the pixel numbers have been greatly increased in order to increase resolution while maintaining the same chip area, thereby continuously decreasing the pixel sizes and decreasing the amount of lights as well as the light collection area. Due to the restriction of the amount of lights and the light collection area of sensing components, even with the continuous progress of semiconductor manufacturing processes, the pixel areas of sensing components still cannot be further reduced, the pixel numbers still cannot be further increased, and thus the resolution of image sensing chips cannot be further increased as well. Therefore, how to increase the amount of lights and the light conversion efficiency have been the current research and development focus of current image sensing components.

SUMMARY

One exemplary embodiment of the present disclosure relates to an image sensor. The image sensor includes a pixel sensing circuit, a pixel electrode, and an opto-electrical conversion layer. The pixel sensing circuit is corresponding to a pixel region. The pixel electrode is disposed on the pixel sensing circuit. The pixel electrode is corresponding to a first pixel region and a second pixel region, the pixel electrode include a first electrode and a second electrode and is electrically connected to the pixel sensing circuit. The first electrode and the second electrode are coplanar and have different polarities. The first electrode or the second electrode located in the first pixel region is adjacent to the first electrode or the second electrode having the same polarity located in the second pixel region. The opto-electrical conversion layer is disposed on the pixel sensing circuit and the pixel electrode. The opto-electrical conversion layer includes a carrier transport layer and a photo sensing layer disposed on the carrier transport layer, and the carrier transport layer is located between the pixel electrode and the photo sensing layer.

Another exemplary embodiment of the present disclosure relates to an image sensor. The image sensor includes a pixel sensing circuit, a pixel isolation structure, a pixel electrode, and an opto-electrical conversion layer. The pixel isolation structure is disposed on the pixel sensing circuit. The pixel electrode includes a first electrode and a second electrode, and the first electrode and the second electrode are electrically connected to the pixel sensing circuit. The first electrode and the second electrode are coplanar. The opto-electrical conversion layer is disposed on the pixel sensing circuit, and the opto-electrical conversion layer is disposed within the pixel isolation structure. A top surface of the opto-electrical conversion layer is below or equal to a top surface of the pixel isolation structure.

Another exemplary embodiment of the present disclosure relates to an image sensor. The image sensor includes a pixel sensing circuit, a pixel electrode, and an opto-electrical conversion layer. The pixel sensing circuit is corresponding to a plurality of pixel regions. The pixel electrode is disposed on the pixel sensing circuit. The pixel electrode includes a first electrode and a second electrode and is electrically connected to the pixel sensing circuit. The first electrode and the second electrode are coplanar, and have different polarities. The opto electrical conversion layer is disposed on the pixel sensing circuit. The opto-electrical conversion layer includes a plurality of opto-electrical conversion portions, each of the opto-electrical conversion portions is corresponding to each of the pixel regions, and the opto-electrical conversion portions are separated from each other by a pixel isolation trench.

Another exemplary embodiment of the present disclosure relates to a manufacturing method of an image sensor. The manufacturing method of the image sensor includes the following steps: providing a pixel sensing circuit, the pixel sensing circuit corresponding to a plurality of pixel regions; disposing a pixel electrode on the pixel sensing circuit, the pixel electrode including a first electrode and a second electrode and electrically connected to the pixel sensing circuit, wherein the first electrode and the second electrode are coplanar and have different polarities; and disposing an opto-electrical conversion layer on the pixel sensing circuit, wherein the opto-electrical conversion layer includes a plurality of opto-electrical conversion portions, each of the opto-electrical conversion portions is corresponding to each of the pixel regions, and the opto-electrical conversion portions are separated from each other by a pixel isolation trench.

The following description is made with reference to the accompanying drawings and embodiments.

DETAILED DESCRIPTION

Figure 1A:
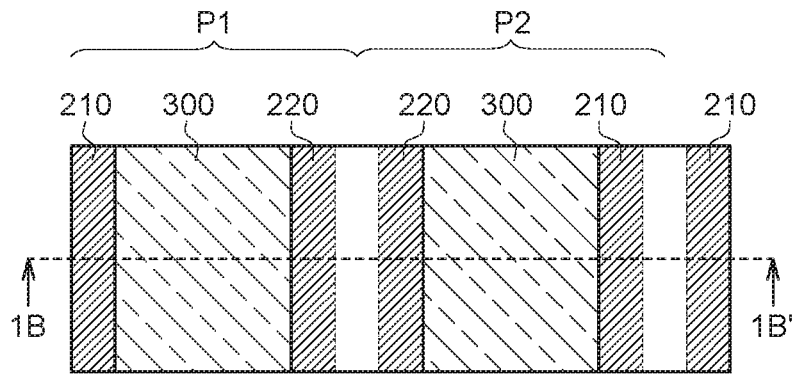
FIG. 1A is a top view of an image sensor according to an embodiment of the present disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

In the embodiments of the present disclosure, in the image sensor, a top surface of the opto-electrical conversion layer is below or equal to a top surface of the pixel isolation structure, such that the as-formed opto-electrical conversion layer could be isolated within a pixel region by the pixel isolation structure due to the height difference of the two top surfaces; accordingly, issues of occurrence of crosstalk caused by the opto-electrical conversion layer in adjacent pixel regions could be prevented. Details of embodiments of the present disclosure are described hereinafter with accompanying drawings. Specific structures and compositions disclosed in the embodiments are for examples and for explaining the disclosure only and are not to be construed as limitations. A person having ordinary skill in the art may modify or change corresponding structures and compositions of the embodiments according to actual applications.

Figure 1B:
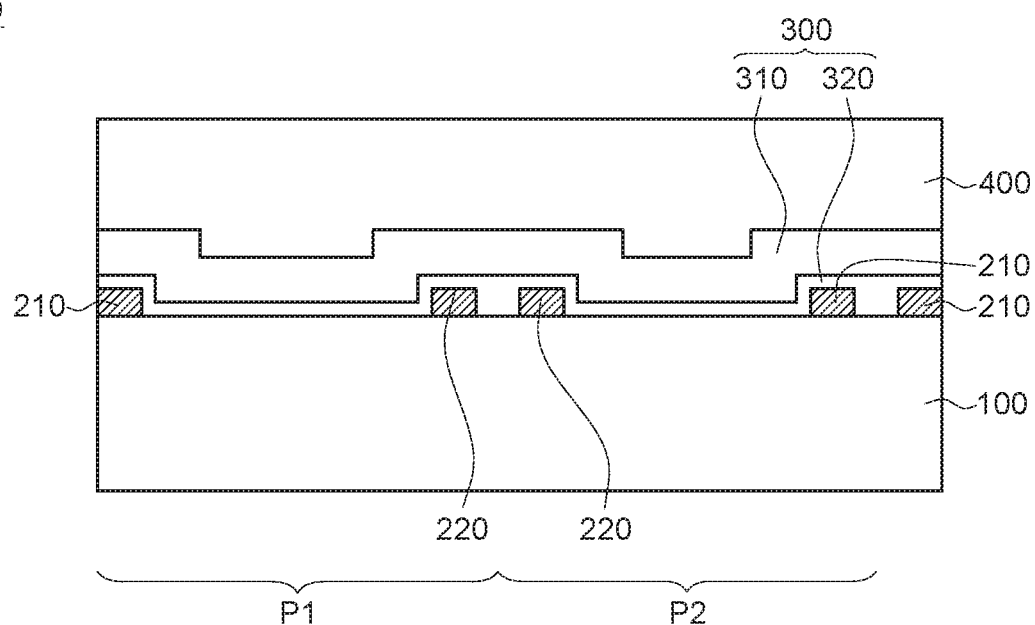
FIG. 1B is a cross-sectional view along the cross-section line 1B-1B in FIG. 1A.

FIG. 1A is a top view of an image sensor according to an embodiment of the present disclosure, and FIG. 1B is a cross-sectional view along the cross-section line 1B-1B' in FIG. 1A. As shown in FIGS. 1A-1B, the image sensor 10 includes a pixel sensing circuit 100, a pixel electrode (e.g. 210, 220), an opto-electrical conversion layer 300, and a water-oxygen barrier film 400. The pixel sensing circuit 100 is corresponding to at least a first pixel region P1 and a second pixel region P2 adjacent to each other. The pixel electrode is disposed on the pixel sensing circuit 100. The pixel electrode is corresponding to the first pixel region P1 and the second pixel region P2, the pixel electrode includes a first electrode 210 and a second electrode 220, and the pixel electrode is electrically connected to the pixel sensing circuit 100. The first electrode 210 and the second electrode 220 are coplanar and have different polarities. The first electrode 210 or the second electrode 220 located in the first pixel region P1 is adjacent to the first electrode 210 or the second electrode 220 having the same polarity located in the second pixel region P2. The opto-electrical conversion layer 300 is disposed on the pixel sensing circuit 100 and the pixel electrode. The opto-electrical conversion layer 300 includes a photo sensing layer 310 and a carrier transport layer 320, the photo sensing layer 310 is disposed on the carrier transport layer 320, and the carrier transport layer 320 is located between the pixel electrode (the first electrode 210 and the second electrode 22) and the photo sensing layer 310. A bottom surface of the pixel electrode is aligned with or under a bottom surface of the opto-electrical conversion layer 300.

In the opto-electrical conversion layer 300, the photo sensing layer 310 absorbs photons and generates excitons, and the excitons dissociate into electrons and holes. Under the influence of electrical fields, the electrons and the holes move respectively toward two poles forming opto currents. In actual operational conditions, the generation of electrical fields may come from electrodes, differences in energy levels of opto-electrical conversion layer 300 or the applied operational voltages. In the embodiment, the carrier transport layer 320 may be an electron transport layer (ETL) or a hole transport layer (HTL), providing with functions of enhancing separations of excitons and transporting carriers, and thus the overall opto-electrical conversion efficiency of the opto-electrical conversion layer 300 could be increased. In addition, the carrier transport layer 320 also may have functions of a carrier barrier layer. In other words, backflows of carriers from the electrodes toward the opto-electrical conversion layer 300 could be stopped, and thus the dark current could be effectively inhibited; or the carrier transport layer 320 may prevent the interactions at the interface between the photo sensing layer 310 and the electrode, thereby the stability of electrodes could be improved.

In the embodiment, the material of the carrier transport layer 320 includes titanium dioxide ($TiO_2$), zinc oxide (ZnO), aluminum oxide ($Al_2O_3$), [6,6]-phenyl-C61-butyric acid methyl ester (PCBM), poly(3,4-ethylenedioxythiophene) polystyrene sulfonate (PEDOT:PSS), nickel oxide (NiO) and/or vanadium oxide ($V_2O_5$), poly [(9,9-bis(3'-(N, N-dimethylamino)propyl)-2,7-fluorene)-alt-2,7-(9,9-dioctylfluore ne)] (PFN), ethoxyl polyethylene imine (PEIE), PEI, molybdenum trioxide ($MoO_3$), tungsten trioxide ($WO_3$), lithium fluoride (LiF), bathophenanthroline (bphen), or Tris-(8-hydroxyquinoline)aluminum (Alq3), but not limited thereto.

Since the generation of electrical fields may come from electrodes, differences in energy levels of opto-electrical conversion layer 300 or the applied operational voltages, and the electrons and holes may be influenced by the electrical fields and form opto currents, when the carrier transport layer 320 is used as a carrier barrier layer, suitable materials can be selected through matching of energy levels, such that dark current can be effectively reduced without sacrificing too much opto-electrical conversion efficiency.

In an embodiment, an energy barrier formed between the carrier transport layer 320 and the pixel electrode is such as larger than an operational voltage of the image sensor. For example, the energy barrier formed between the carrier transport layer 320 and the pixel electrode is such as larger than the operational voltage of about 0.3 eV of the image sensor. As such, the electrons or holes when applied with an operational voltage can be prevented from having enough energy to across the energy barrier to create dark currents.

For example, the carrier transport layer 320 used as a carrier barrier layer may include the following three types of barrier layers: (1). an electron/hole barrier layer, of which the material may be 1,3,5-tris(N-phenylbenzimiazole-2-yl) benzene (TPBI), tris(4-carbazoyl-9-ylphenyl)amine (TCTA), or the combination; (2). a hole barrier layer, of which the material may be $TiO_2$, ZnO or the combination; and (3). an electron barrier layer, of which the material may be PFN, $MoO_3$, N,N'-Bis-(1-naphthalenyl)-N,N'-bis-phenyl-(1,1'-biphenyl)-4,4'-diamine (NPB), or any combination of the above. The above material can match, for example, a pixel electrode made of aluminum with work function of about 4.2 eV and a photo sensing layer made of perovskite with HOMO of about 5.45 eV and LUMO of about 3.95 eV.

In the embodiment, the material of the first electrodes 210 is such as different from the material of the second electrodes 220. By matching the different work functions of different electrode materials to the energy levels of the opto-electrical conversion layer 300, the conversion efficiency of the opto-electrical conversion layer 300 could be further increased, and the dark currents could be inhibited. In some embodiments, the material of the first electrodes 210 and the material of the second electrodes 220 may respectively include aluminum (Al), gold (Au), silver (Ag), titanium (Ti), nickel (Ni), copper (Cu), tantalum (Ta), tungsten (W), titanium nitride (TiN), an alloy of the aforementioned metals, and/or Al capped with or cladded with TiN, or another metal which is compatible with a semiconductor manufacturing process.

In the embodiment, in the opto-electrical conversion layer 300, a modification layer (not shown in drawings) may be located on the photo sensing layer 310 for reducing defects on the surface of the photo sensing layer or defects among grains. The material of the modification layer may be fullerene derivative (PCBM) or other materials of function as reducing dangling bond.

Figure 2A:
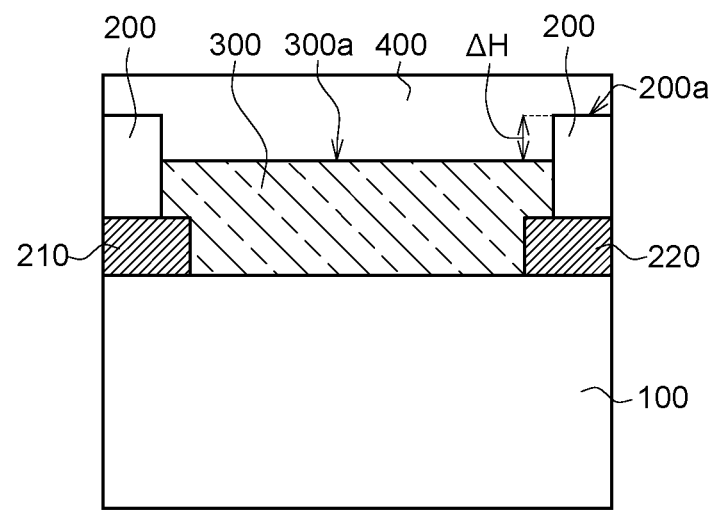
FIG. 2A is a schematic view of an image sensor according to another embodiment of the present disclosure.

FIG. 2A is a schematic view of an image sensor according to another embodiment of the present disclosure. The elements in the present embodiment sharing the same or similar labels with those in the previous embodiments are the same or similar elements, and the description of which is omitted.

As shown in FIG. 2A, the image sensor 20-1 includes a pixel sensing circuit 100, a pixel electrode (the first electrode 210 and the second electrode 220), a pixel isolation structure 200, and an opto-electrical conversion layer 300. The pixel isolation structure 200 is disposed on the pixel sensing circuit 100. In the embodiment, the pixel electrode is electrically connected to the pixel sensing circuit 100 and includes a first electrode 210 and a second electrode 220. The opto-electrical conversion layer 300 is disposed on the pixel sensing circuit 100, the opto-electrical conversion layer 300 is located within the pixel isolation structure 200, and a top surface 300a of the opto-electrical conversion layer 300 is below a top surface 200a of the pixel isolation structure 200.

In the embodiment, as shown in FIG. 2A, a height difference ΔH between the top surface 300a of the opto-electrical conversion layer 300 and the top surface 200a of the pixel isolation structure 200 is such as larger than 0, which may be adjusted according to various manufacturing processes. For example, in an embodiment, the height difference ΔH may be such as larger than or equal to 0.1 μm. In some embodiments, the height of the opto-electrical conversion layer 300 is such as 0.2-0.5 μm, and the height of the pixel isolation structure 200 is such as larger than 0.2 μm. In some other embodiments, the top surface 300a of the opto-electrical conversion layer 300 may be substantially aligned with the top surface 200a of the pixel isolation structure 200 (not shown in drawings), and the height difference ΔH is such as equal to 0 (that is, the top surface 300a of the opto-electrical conversion layer 300 is substantially equal to the top surface 200a of the pixel isolation structure 200, and there is no height difference).

In the embodiment, the top surface 300a of the opto-electrical conversion layer 300 is below the top surface 200a of the pixel isolation structure 200, such that the as-formed opto-electrical conversion layer 300 could be naturally isolated within a pixel region by the pixel isolation structure 200 due to the height difference ΔH; accordingly, issues of occurrence of crosstalk caused by the opto-electrical conversion layer 300 in adjacent pixel regions could be prevented.

As shown in FIG. 2A, the first electrode 210 and the second electrode 220 are both disposed on the pixel sensing circuit 100 and are coplanar. In comparison to the conventional design of stacking two electrodes vertically, the single-layered electrode design of the first electrode 210 and the second electrode 220 may further increase the amount of receiving lights.

In the embodiment, the material of the first electrode 210 and the material of the second electrode 220 may be the same or different. In the embodiment, the material of the first electrode 210 and the material of the second electrode 200 may respectively include aluminum (Al), gold (Au), silver (Ag), titanium (Ti), nickel (Ni), copper (Cu), tantalum (Ta), tungsten (W), titanium nitride (TiN), and/or Al capped with or cladded with TiN, or other metal which is compatible with a semiconductor manufacturing process, but not limited thereto.

In some embodiments, the opto-electrical conversion layer 300 may include an organic material of an inorganic-organic composite material, for example, a quantum dot material, a single crystal methyl ammonium lead iodide perovskite material, a poly crystal methyl ammonium lead iodide perovskite material, an amorphous methyl ammonium lead iodide perovskite material, or a single crystal, poly crystal, or amorphous methyl ammonium lead iodide chloride perovskite material. For example, the quantum dot material may be a quantum dot film, the methyl ammonium lead iodide perovskite material may be methyl ammonium lead tri-iodide perovskite ($CH_3NH_3PbI_3$), and the methyl ammonium lead iodide chloride perovskite material may be methyl ammonium lead di-iodide chloride perovskite ($CH_3NH_3PbI_2Cl$) or methyl ammonium lead iodide chloride perovskite ($CH_3NH_3PbI_{3-x}Cl_x$).

As shown in FIG. 2A, in the embodiment, the image sensor 20-1 may further include a water-oxygen barrier film 400 (or a water barrier film). The water-oxygen barrier film 400 (or the water barrier film) covers the pixel sensing circuit 100, the pixel isolation structure 200, and the opto-electrical conversion layer 300. In the embodiment as shown in FIG. 2A, the bottom surface of the pixel electrode (the first electrode 210 and the second electrode 220) is aligned with the bottom surface of the opto-electrical conversion layer 300.

Figure 2B:
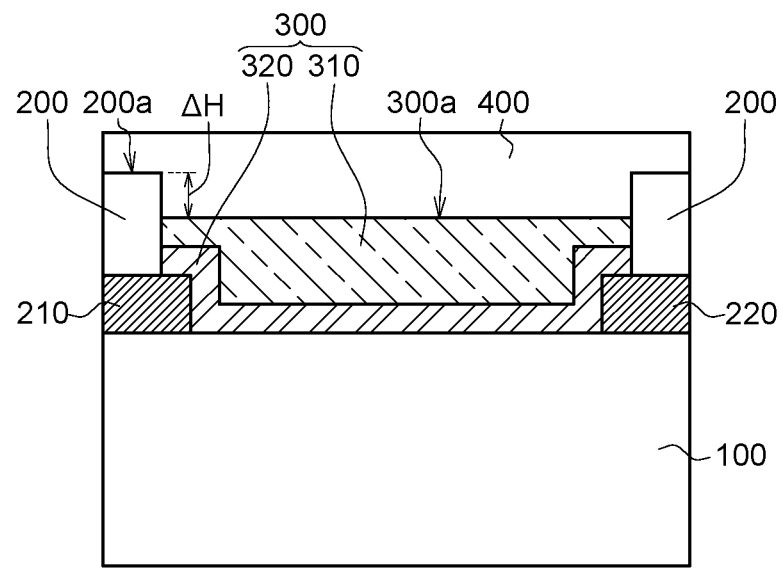
FIG. 2B is a schematic view of an image sensor according to another embodiment of the present disclosure.

FIG. 2B is a schematic view of an image sensor according to another embodiment of the present disclosure. The elements in the present embodiment sharing the same or similar labels with those in the previous embodiments are the same or similar elements, and the description of which is omitted. The present embodiment is different from the embodiment as shown in FIG. 2A mainly in the design of the opto-electrical conversion layer 300.

Please refer to FIG. 2B. In the image sensor 20-2, the opto-electrical conversion layer 300 may include a photo sensing layer 310 and a carrier transport layer 320. The carrier transport layer 320 is disposed between the pixel electrode (the first electrode 210 and the second electrode 220) and the photo sensing layer 310. In the embodiment as shown in FIG. 2B, the bottom surface of the pixel electrode (the first electrode 210 and the second electrode 220) is aligned with the bottom surface of the opto-electrical conversion layer 300. In the embodiment, the carrier transport layer 320 may be such as an electron transport layer (ETL) or a hole transport layer (HTL), providing with functions of enhancing separations of excitons and transporting carriers, and thus the overall opto-electrical conversion efficiency of the opto-electrical conversion layer 300 could be increased. In addition, the carrier transport layer 320 also has functions of a carrier barrier layer, such that back-flows of carriers from the electrodes toward the opto-electrical conversion layer 300 could be stopped, and thus the dark current could be effectively inhibited, and the stability of electrodes could be improved.

In the present embodiment, as shown in FIG. 2B, the top surface of the carrier transport layer 320 may be below the top surface 200a of the pixel isolation structure 200.

In the embodiment, the material of the carrier transport layer 320 may include such as titanium dioxide ($TiO_2$), zinc oxide (ZnO), aluminum oxide ($Al_2O_3$), [6,6]-phenyl-C61-butyric acid methyl ester (PCBM), polystyrene sulfonate (PEDOT:PSS), nickel oxide (NiO) and/or vanadium oxide ($V_2O_5$), poly[(9,9-bis(3'-(N,N-dimethylamino)propyl)-2,7-fluorene)-alt-2,7-(9,9-dioctylflu orene)] (PFN), ethoxy) polyethylene imine (PEIE), PEI, molybdenum trioxide ($MoO_3$), tungsten trioxide ($WO_3$), lithium fluoride (LiF), bathophenanthroline (bphen), or Tris-(8-hydroxyquinoline) aluminum (Alq3).

Figure 3A:
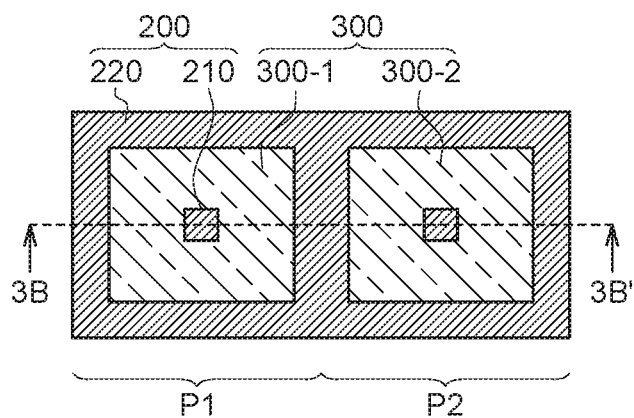
FIG. 3A is a top view of an image sensor according to an additional embodiment of the present disclosure.
Figure 3B:
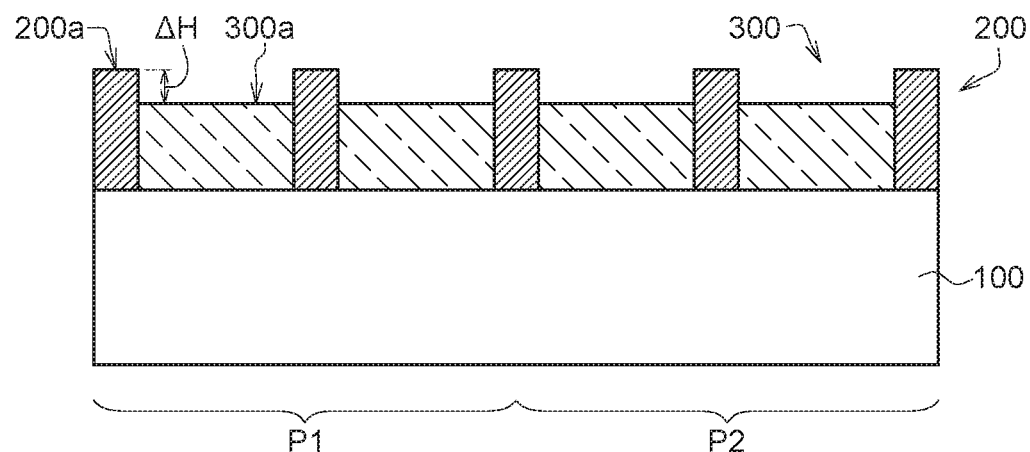
FIG. 3B is a cross-sectional view along the cross-section line 3B-3B' in FIG. 3A.

FIG. 3A is a top view of an image sensor according to an additional embodiment of the present disclosure, and FIG. 3B is a cross-sectional view along the cross-section line 3B-3B' in FIG. 3A. The elements in the present embodiment sharing the same or similar labels with those in the previous embodiments are the same or similar elements, and the description of which is omitted. The present embodiment is different from the embodiment as shown in FIG. 2A mainly in the design that the pixel isolation structure 200 defines multiple pixel regions.

As shown in FIGS. 3A-3B, in the image sensor 30, the pixel isolation structure 200 defines a plurality of pixel regions, for example, the pixel region P1 and the pixel region P2 as shown in FIGS. 3A-3B. The opto-electrical conversion layer 300 has a plurality of opto-electrical conversion portions separated from one another, for example, the opto-electrical conversion portions 300-1 and 300-2 as shown in FIGS. 3A-3B. Each of the opto-electrical conversion portions is disposed corresponding to each of the pixel regions; for example, the opto-electrical conversion portion 300-1 is disposed corresponding to the pixel region P1, the opto-electrical conversion portion 300-2 is disposed corresponding to the pixel region P2, and the opto-electrical conversion portion 300-1 is separated from the opto-electrical conversion portion 300-2.

As shown in FIGS. 3A-3B, in the image sensor 30, the first electrode 210 is located in the middle of an opto-electrical conversion portion, and the second electrode 220 surrounds each of the opto-electrical conversion portions and defines each of the pixel regions. In the embodiment as shown in FIG. 3A, the second electrode 220 fully surrounds one opto-electrical conversion portion. In some other embodiments, the second electrode 220 may have small openings (not shown in drawings). When the opto-electrical conversion layer is made by a wet manufacturing process, the small openings allow the material of the opto-electrical conversion layer to flow to the second electrode located at other pixel region(s); accordingly, the opto-electrical conversion layer could be formed with equal heights in multiple pixel regions.

Figure 4A:
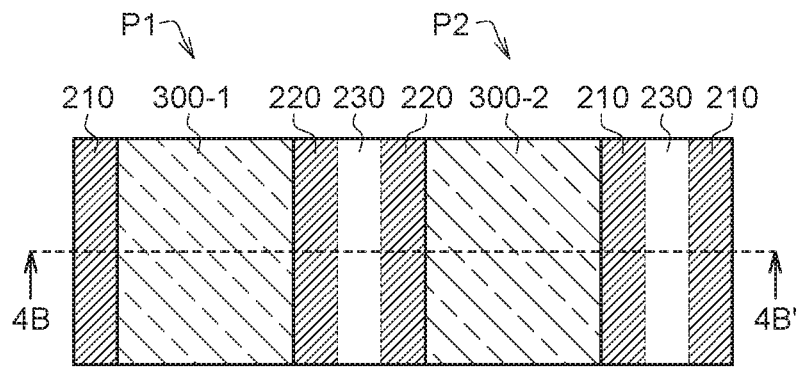
FIG. 4A is a top view of an image sensor according to a further embodiment of the present disclosure.
Figure 4B:
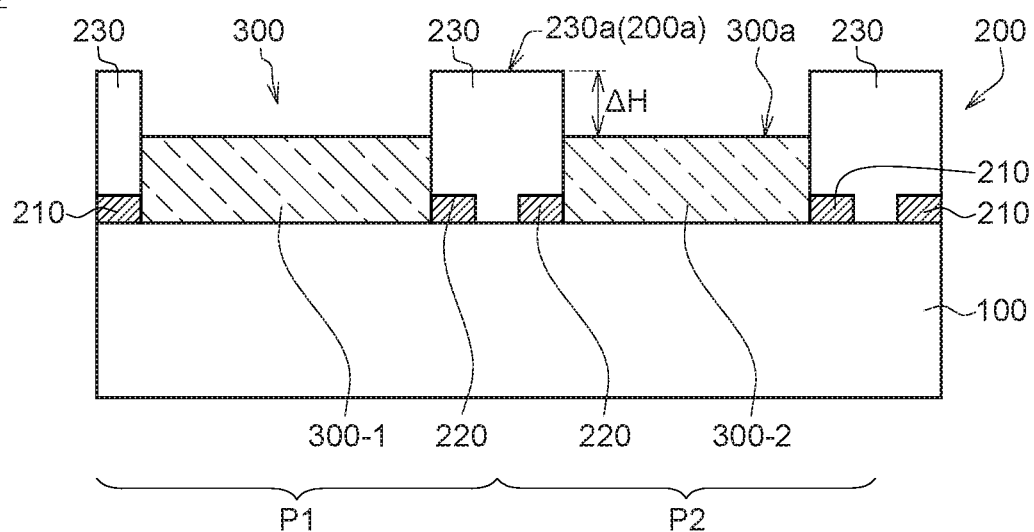
FIG. 4B is a cross-sectional view along the cross-section line 4B-4B' in FIG. 4A.

FIG. 4A is a top view of an image sensor according to a further embodiment of the present disclosure, FIG. 4B is a cross-sectional view along the cross-section line 4B-4B' in FIG. 4A, and FIGS. 4C-4E are cross-sectional views along the cross-section line 4B-4B' according to some embodiments. The elements in the present embodiment sharing the same or similar labels with those in the previous embodiments are the same or similar elements, and the description of which is omitted. The present embodiment is different from the embodiment as shown in FIGS. 3A-3B mainly in the design of the pixel isolation structure 200.

As shown in FIGS. 4A-4B, in the image sensor 40, the pixel isolation structure 200 may further include a plurality of non-conductive layers 230. The pixel isolation structure 200 (e.g. the non-conductive layer 230) is located on the first electrode 210 and the second electrode 220.

As shown in FIGS. 4A-4B, the top surface 200a of the pixel isolation structure 200 is the top surfaces 230a of the non-conductive layers 230. Therefore, the height difference ΔH between the top surface 200a of the pixel isolation structure 200 and the top surface 300a of the opto-electrical conversion layer 300 is the height difference between the top surfaces 230a of the non-conductive layers 230 and the top surface 300a of the opto-electrical conversion layer 300. In the embodiment as shown in FIGS. 4A-4B, the pixel isolation structure 200 (e.g. the non-conductive layer 230) is located on the first electrode 210 and the second electrode 220. In the embodiment, the material of the non-conductive layers 230 is such as silicon nitride or silicon oxide, and the opto-electrical conversion layer 300 is located between two non-conductive layers 230.

In the embodiment as shown in FIG. 4B, a sidewall of the pixel isolation structure 200 of the image sensor 40 is substantially aligned with the sides of the first electrode 210 and the second electrode 220. For example, as shown in FIG. 4B, a sidewall of the non-conductive layer 230 of the image sensor 40 is substantially aligned with the sides of the first electrode 210 and the second electrode 220.

Figure 4C:
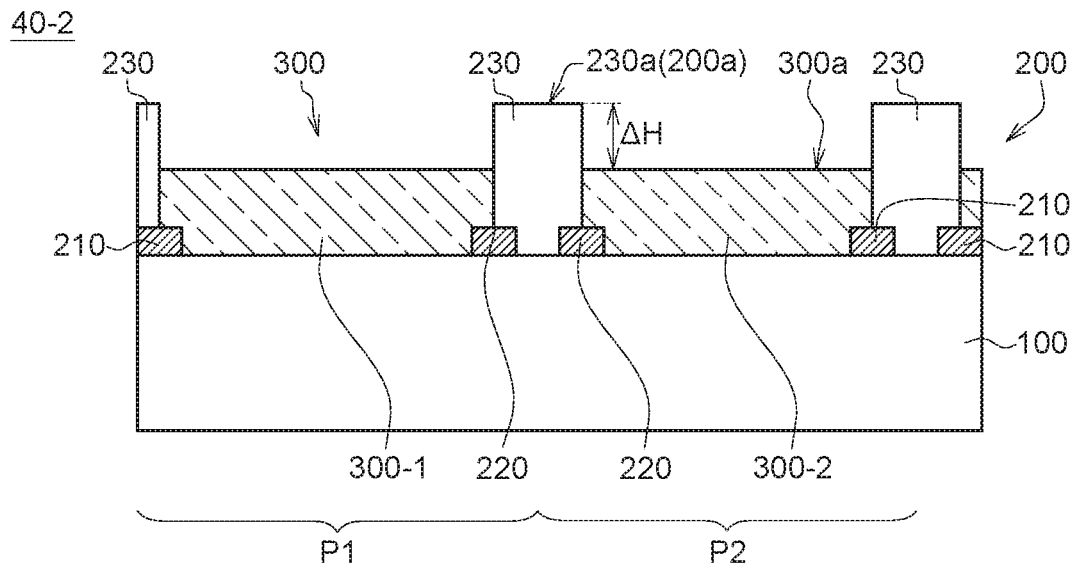
FIGS. 4C-4E are cross-sectional views along the cross-section line 4B-4B' according to some embodiments.
Figure 4D:
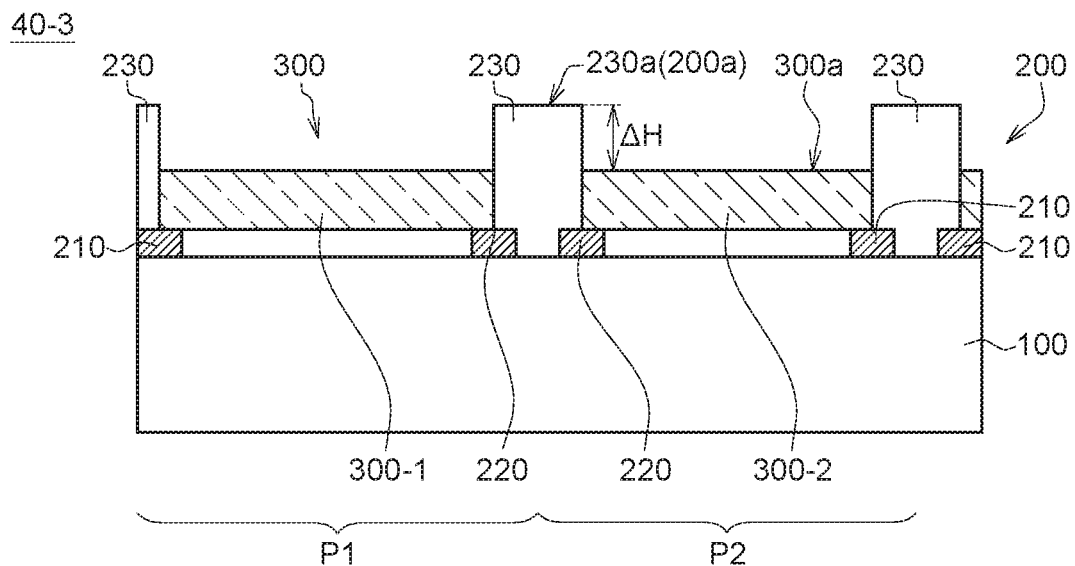
Figure 4E:
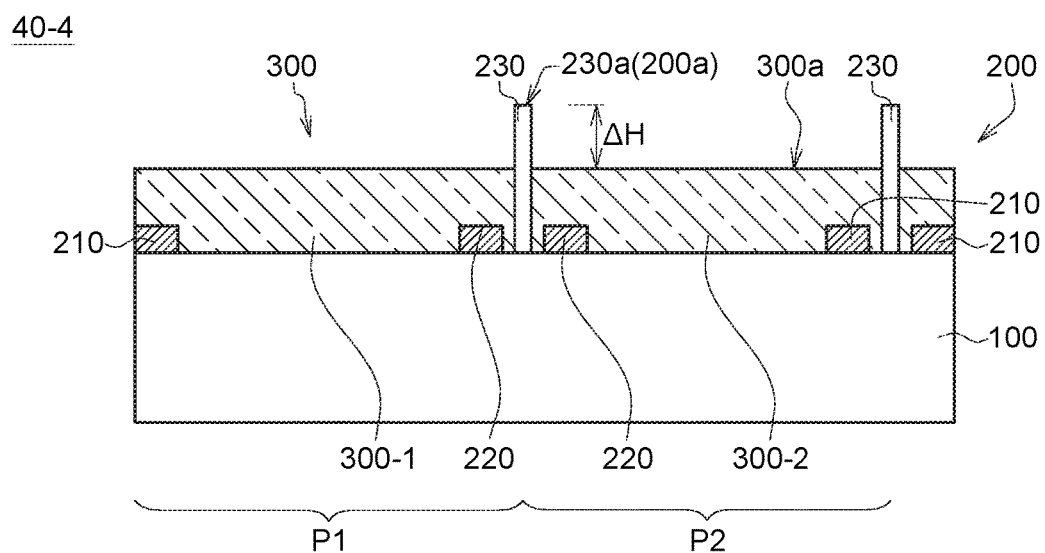

Please refer to FIGS. 4C-4E. In the embodiment as shown in FIG. 4C, the pixel isolation structure 200 (e.g. the non-conductive layer 230) of the image sensor 40-2 is located on part of the top surfaces of the first electrode 210 and the second electrode 220 and partly exposed the top surfaces of the first electrode 210 and the second electrode 220. In the embodiment as shown in FIG. 4D, the pixel isolation structure 200 (e.g. the non-conductive layer 230) is located on the first electrode 210 and the second electrode 220 and a part of it extends towards where between the first electrode 210 and the second electrode 220, and the opto-electrical conversion layer 300 is located on the non-conductive layer 230, the first electrode 210 and the second electrode 220. Moreover, in the embodiment as shown in FIG. 4D, the bottom surface of the pixel electrode (the first electrode 210 and the second electrode 220) is under the bottom surface of the opto-electrical conversion layer 300 (the opto-electrical conversion portions 300-1 and 300-2).

In the embodiment as shown in FIG. 4E, the pixel isolation structure 200 of the image sensor 40-4 is located between the pixel electrodes in adjacent pixel regions. For example, the pixel isolation structure 200 is located between the first electrode 210 or the second electrode 220 located in the first pixel region P1 and the first electrode 210 or the second electrode 220 having the same polarity located in the second pixel region P2. In addition, in the embodiment as shown in FIG. 4E, the pixel isolation structure 200 is separated from the pixel electrode by a gap. For example, as shown in FIG. 4E, the non-conductive layer 230 of the pixel isolation structure 200 is separated from the second electrode 220 in the first pixel region P1 and is separated from the second electrode 220 in the second pixel region P2 by another gap, and the opto-electrical conversion layer 300 is further filled in the gaps.

Figure 5:
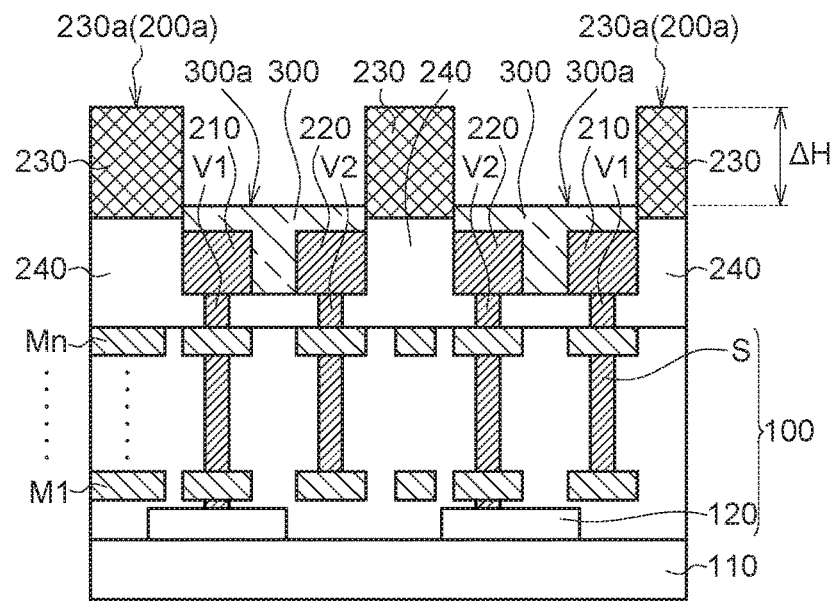
FIG. 5 is a schematic view of an image sensor according to a still further embodiment of the present disclosure.

FIG. 5 is a schematic view of an image sensor according to a still further embodiment of the present disclosure. The elements in the present embodiment sharing the same or similar labels with those in the previous embodiments are the same or similar elements, and the description of which is omitted.

As shown in FIG. 5, in the image sensor 50, the top surface 300a of the opto-electrical conversion layer 300 is located above the top surfaces of the first electrode 210 and the second electrode 220. In other words, the opto-electrical conversion layer 300 of the image sensor 50 is located between two non-conductive layers 230, and the non-conductive layers 230 are located between the first electrode 210 and the second electrode 220.

In the embodiment, the image sensor 50 may further include a silicon substrate 110, and the pixel sensing circuit 100 is located above the silicon substrate 110. In the embodiment, the pixel sensing circuit 100 may include an electronic component 120, metal layers M1-Mn, connection vias S, amplifiers, and etc. For example, the electronic component 120 may be a transistor for signal reading, the metal layers M1-Mn may include electrical components such as capacitors, and the connection vias S may be used as such as signal paths, but not limited thereto. In the embodiment, is the first electrode 210 and the second electrode 220 are electrically connected to the pixel sensing circuit 100 through such as a connection via. For example, the first electrode 210 and the second electrode 220 are electrically connected to the metal layer Mn and the electronic component 120 of the pixel sensing circuit 100 through the connection vias V1 and V2 respectively. In the embodiment, the pixel isolation structure 200 may further include a non-conductive layer 240. The non-conductive layers 230 are located on the non-conductive layer 240. The non-conductive layer 240 is made by such as a dielectric material, e.g. silicon oxide layer, and the non-conductive layers 230 are used as a pixel isolation structure and are such as silicon nitride layers.

In the embodiments as previously shown in FIGS. 3A-5, the upmost metal layer in the semiconductor manufacturing process is used as the first electrode 210 and the second electrode 220 (pixel electrode).

Figure 6:
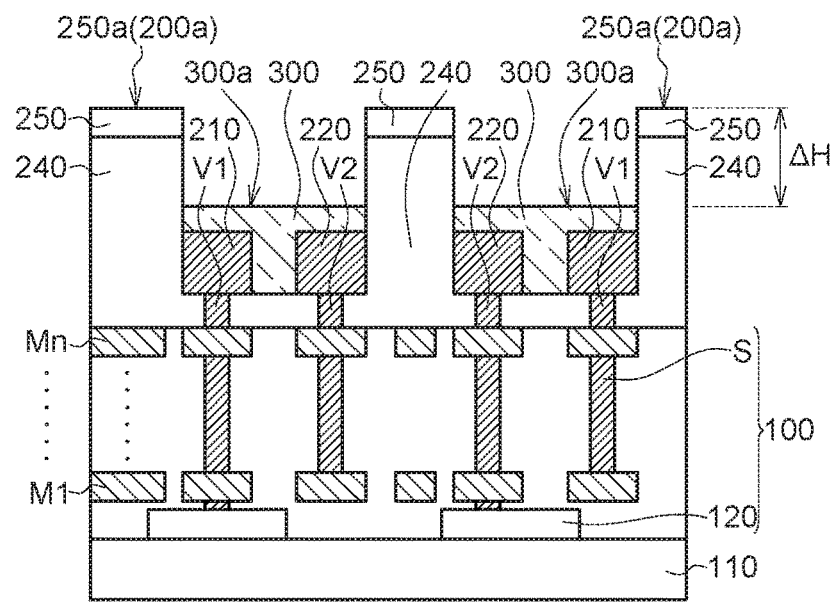
FIG. 6 is a schematic view of an image sensor according to another further embodiment of the present disclosure.

FIG. 6 is a schematic view of an image sensor according to another further embodiment of the present disclosure. The elements in the present embodiment sharing the same or similar labels with those in the previous embodiments are the same or similar elements, and the description of which is omitted. In the present embodiment, the second upmost metal layer is used as the first electrode 210 and the second electrode 220 (pixel electrode).

As shown in FIG. 6, in the image sensor 60, the pixel isolation structure 200 may further include a plurality of metal layers 250 located above the first electrode 210 and the second electrode 220. As shown in FIG. 6, the top surface 200a of the pixel isolation structure 200 is the top surfaces 250a of the metal layers 250. Accordingly, the height difference ΔH between the top surface 200a of the pixel isolation structure 200 and the top surface 300a of the opto-electrical conversion layer 300 is the height difference between the top surfaces 250a of the metal layers 250 and the top surface 300a of the opto-electrical conversion layer 300. The metal layers 250 are electrically isolated from the first electrode 210 and the second electrode 220. In the embodiment as shown in FIG. 6, the top surface 300a of the opto-electrical conversion layer 300 is located higher the top surfaces of the first electrode 210 and the second electrode 220.

In some embodiments, the metal layers 250 are disposed on the non-conductive layer 240; as such, the metal layers 250, and the non-conductive layer 240 form the pixel isolation structure 200.

Figure 7:
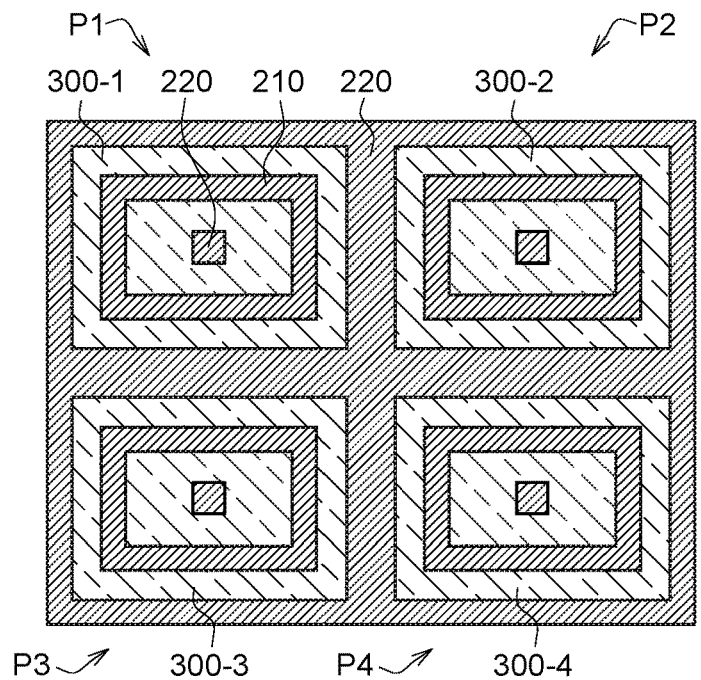
FIG. 7 is a top view of an image sensor according to an additional further embodiment of the present disclosure.

FIG. 7 is a top view of an image sensor according to an additional further embodiment of the present disclosure. The elements in the present embodiment sharing the same or similar labels with those in the previous embodiments are the same or similar elements, and the description of which is omitted. The present embodiment is different from the previous embodiments mainly in the design of arrangements of the first electrode 210 and the second electrode 220.

As shown in FIG. 7, in the image sensor 70, the second electrode 220 defines the pixel regions P1-P4, and the opto-electrical conversion portions 300-1, 300-2, 300-3 and 300-4 are disposed respectively corresponding to the pixel regions P1, P2, P3, and P4. The opto-electrical conversion portions 300-1, 300-2, 300-3 and 300-4 are separated from one another. Each of the pixel regions is basically rectangular.

Figure 8:
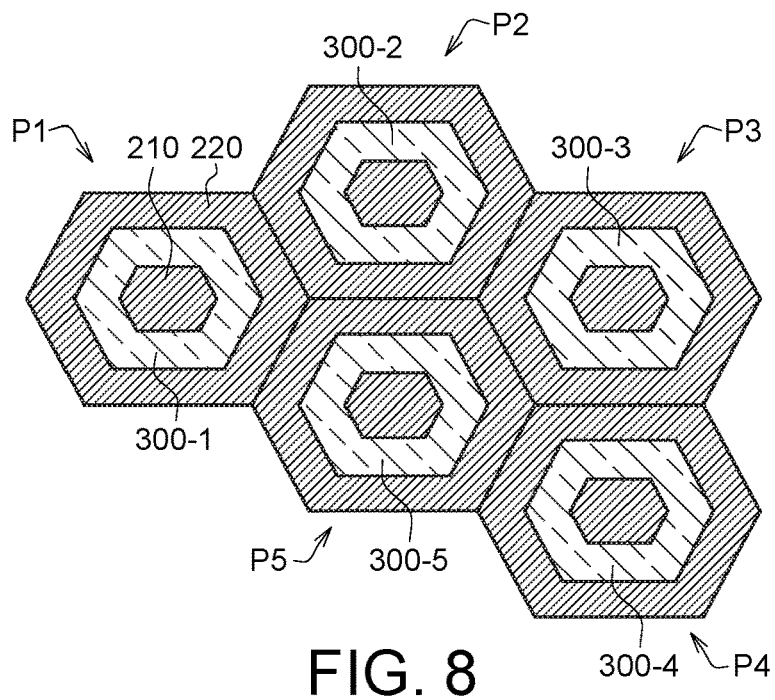
FIG. 8 is a top view of an image sensor according to another additional further embodiment of the present disclosure.

FIG. 8 is a top view of an image sensor according to another additional further embodiment of the present disclosure. The elements in the present embodiment sharing the same or similar labels with those in the previous embodiments are the same or similar elements, and the description of which is omitted. The present embodiment is different from the previous embodiments mainly in the design of arrangements of the first electrode 210 and the second electrode 220.

As shown in FIG. 8, in the image sensor 80, the second electrode 220 defines the pixel regions P1-P5, and the opto-electrical conversion portions 300-1, 300-2, 300-3, 300-4 and 300-5 are disposed respectively corresponding to the pixel regions P1, P2, P3, P4, and P5. The opto-electrical conversion portions 300-1, 300-2, 300-3, 300-4 and 300-5 are separated from one another. Each of the pixel regions is basically hexagonal.

In some other embodiments, in the structures as shown in FIGS. 7-8, the second electrode 220 may have small openings (not shown in drawings), such that the opto-electrical conversion portions of multiple pixel regions P1, P2, P3, and etc. could be connected to one another, and these openings may allow the material of the opto-electrical conversion layer to flow between multiple pixel regions; accordingly, the opto-electrical conversion layer could be formed with equal heights in multiple pixel regions.

Figure 9:
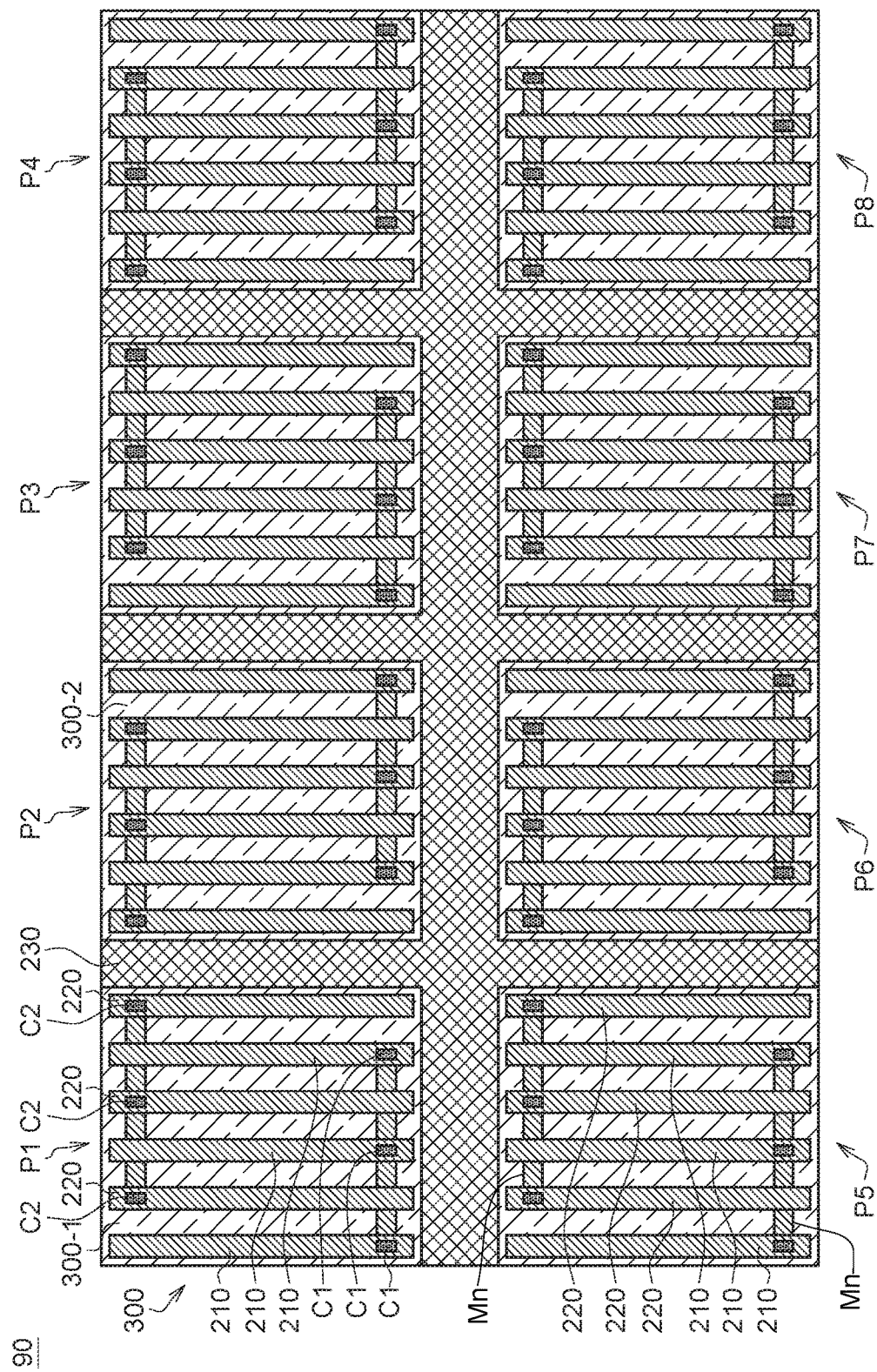
FIG. 9 is a top view of an image sensor according to a still further additional embodiment of the present disclosure.

FIG. 9 is a top view of an image sensor according to a still further additional embodiment of the present disclosure. The elements in the present embodiment sharing the same or similar labels with those in the previous embodiments are the same or similar elements, and the description of which is omitted. The present embodiment is different from the previous embodiments mainly in the design of arrangements of the first electrode 210, the second electrode 220 and the non-conductive layers 230.

As shown in FIG. 9, the image sensor 90 is a 4×2 pixel region array. The first electrodes 210 and the second electrodes 220 are strip electrodes arranged in parallel. In the present embodiment, the pixel isolation structure 200 defines eight pixel regions P1, P2, P3, P4, P5, P6, P7, and P8. In each of the pixel regions, the first electrodes 210 are electrically connected to the metal layer Mn through the connection vias C1, and the second electrodes 220 are electrically connected to the metal layer Mn through the connection vias C2. For example, the pixel sensing circuit 100 may include a plurality of metal layers, the pixel electrode (for example, the first electrode 210) is electrically connected to one metal layer that is separated from the pixel electrode by a shortest distance among the metal layers via the connection vias C1, and the pixel electrode (for example, the second electrode 220) is electrically connected to one metal layer that is separated from the pixel electrode by a shortest distance among the metal layers via the connection vias C2. The opto-electrical conversion layer 300 has eight opto-electrical conversion portions corresponding to the eight pixel regions P1-P8.

Figure 9A:
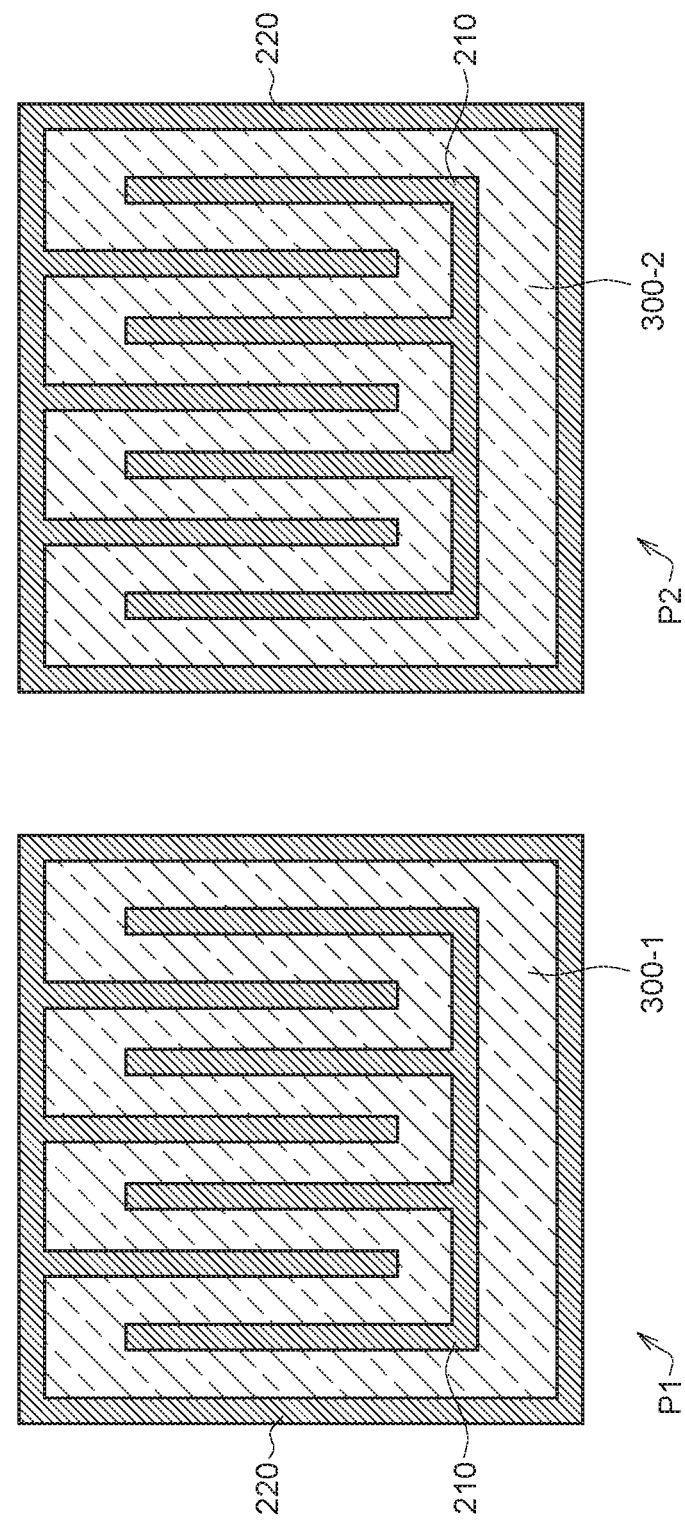
FIG. 9A is a top view of an image sensor according to a still further additional embodiment of the present disclosure.

FIG. 9A is a top view of an image sensor according to a still further additional embodiment of the present disclosure. The elements in the present embodiment sharing the same or similar labels with those in the previous embodiments are the same or similar elements, and the description of which is omitted. The present embodiment is different from the previous embodiments mainly in the design of arrangements of the first electrode 210 and the second electrode 220.

In some embodiments, one of the first electrode 210 and the second electrode 220 surrounds the other one of the first electrode 210 and the second electrode 220. As shown in FIG. 9A, in the image sensor 90-1, the second electrode 220 defines a plurality of pixel regions P1-P2, the opto-electrical conversion portion 300-1 and 300-2 are disposed corresponding to the pixel region P1 and the pixel region P2 respectively, and the opto-electrical conversion portions 300-1 and 300-2 are separated from each other.

In the embodiment, as shown in FIG. 9A, the second electrode 220 surrounds the first electrode 210, thus the adjacent pixel regions are adjacent to each other with the second electrodes 220 of the pixel regions. The second electrode 220 surrounds one pixel region, such that the signal of a single pixel region remains in the pixel region and does not crosstalk to another adjacent pixel region influencing the adjacent pixel region. For example, the second electrode 220 surrounds the pixel region P1, such that the opto current generated by light irradiation of the pixel region P1 is limited within the pixel region P1 and does not crosstalk to the adjacent pixel region P2.

FIGS. 10A-10D show a manufacturing process of an image sensor (the image sensor 20-1 as shown in FIG. 2A) according to an embodiment of the present disclosure. Please refer to FIGS. 2A and 10A-10D, a manufacturing process of an image sensor according to an embodiment of the present disclosure is described hereinafter. The elements in the present embodiment sharing the same or similar labels with those in the previous embodiments are the same or similar elements, and the description of which is omitted.

Figure 10A:
FIGS. 10A-10D show a manufacturing process of an image sensor according to an embodiment of the present disclosure.

As shown in FIG. 10A, in the beginning, a silicon substrate and a pixel sensing circuit 100 located thereon are provided.

Figure 10B:
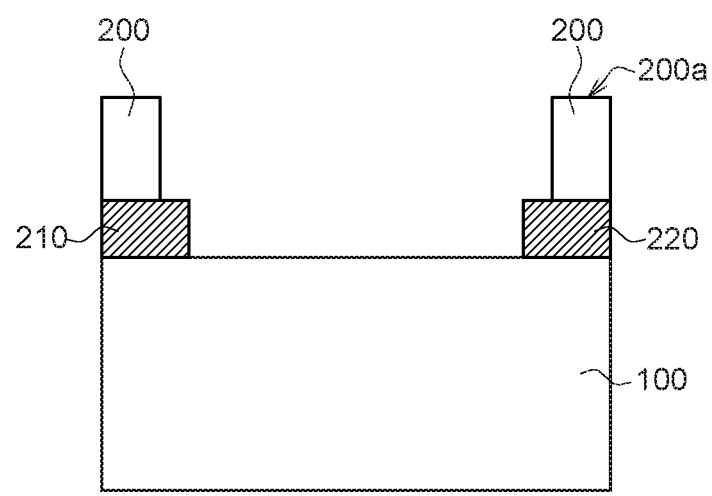

Next, as shown in FIG. 10B, a pixel electrode and a pixel isolation structure 200 are disposed on the pixel sensing circuit 100. As shown in FIG. 10B, the pixel electrode includes a first electrode 210 and a second electrode 220 and is electrically connected to the pixel sensing circuit 100. In the embodiment, the first electrode 210 and the second electrode 220 are manufactured on the pixel sensing circuit 100 by a process, such that the first electrode 210 and the second electrode 220 could be made by the same process, and thus the manufacturing process is simplified.

Figure 10C:
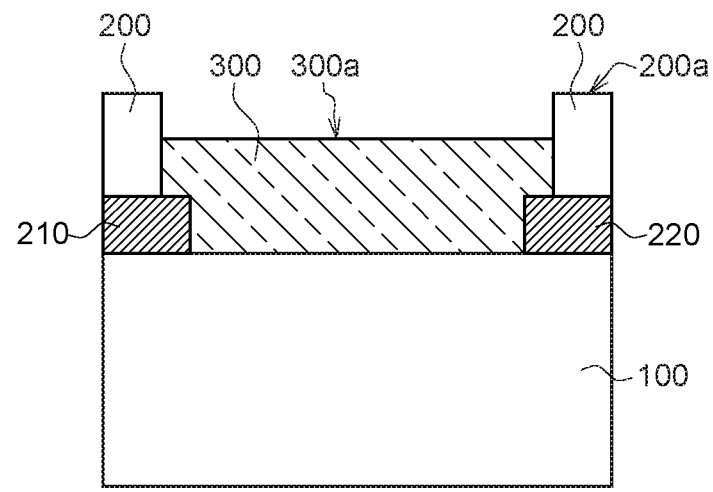

Next, as shown in FIG. 10C, an opto-electrical conversion layer 300 is disposed on the pixel sensing circuit 100, and the top surface 300a of the opto-electrical conversion layer 300 is below the top surface 200a of the pixel isolation structure 200. In the embodiment, the opto-electrical conversion layer 300 is manufactured on the pixel sensing circuit 100 by a coating process or a vapor deposition process. The as-formed opto-electrical conversion layer 300 could be naturally isolated within a pixel region by the pixel isolation structure 200 due to the height difference ΔH between the top surface 200a and the top surface 300a; accordingly, issues of occurrence of crosstalk caused by the opto-electrical conversion layer 300 in adjacent pixel regions could be prevented.

Figure 10D:
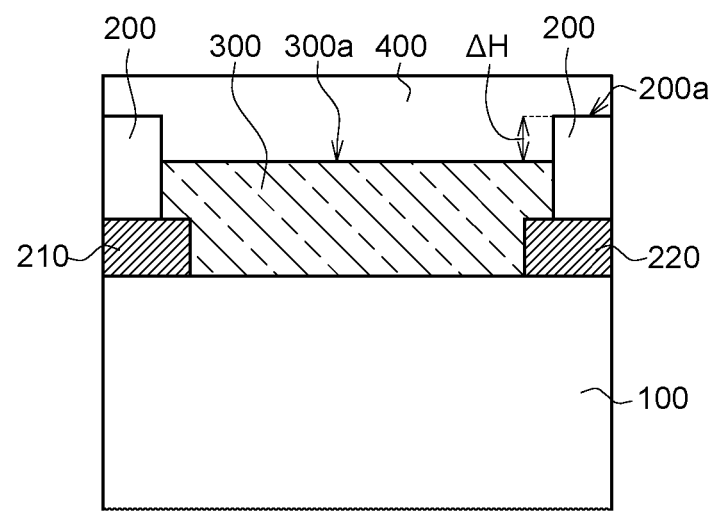

Next, as shown in FIG. 10D, a water-oxygen barrier film 400 is formed. The water-oxygen barrier film 400 covers the pixel sensing circuit 100, the pixel isolation structure 200, and the opto-electrical conversion layer 300. As such, the manufacturing of the image sensor 20-1 as shown in FIG. 10D (FIG. 2A) is completed.

Manufacturing processes of the image sensors 20-2 to 90 as illustrated in FIGS. 2B to 9 are respectively described hereinafter according to the manufacturing process of the image sensor 20-1 described in the previous embodiment.

The manufacturing process of the image sensor 20-2 as shown in FIG. 2B is different from the previous embodiment mainly in the design of the opto-electrical conversion layer 300. In the present embodiment, a carrier transport layer 320 is formed on the pixel isolation structure 200 prior to forming the photo sensing layer 310, and then the photo sensing layer 310 is formed on the carrier transport layer 320, such that the opto-electrical conversion layer 300 is formed.

Figure 11A:
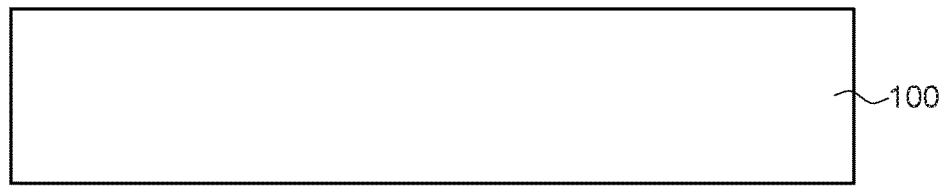
FIGS. 11A-11C show a manufacturing process of an image sensor according to another embodiment of the present disclosure.
Figure 11B:
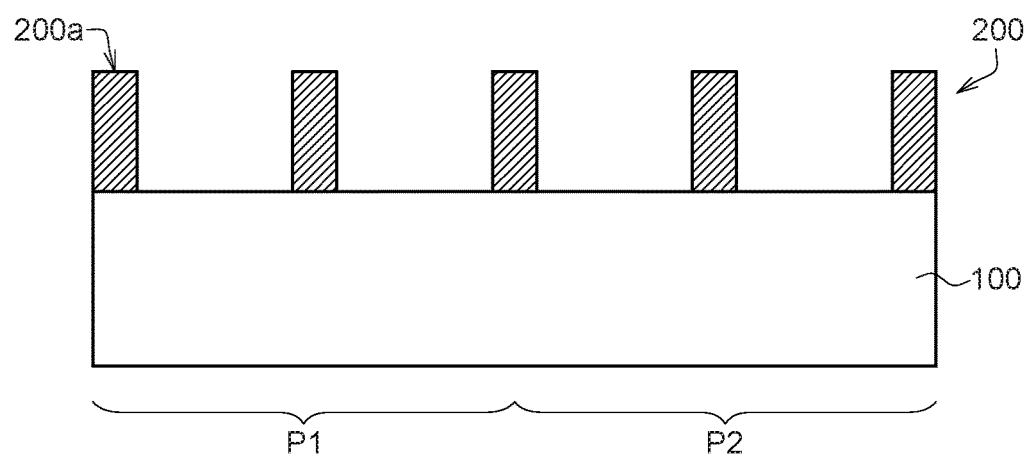
Figure 11C:
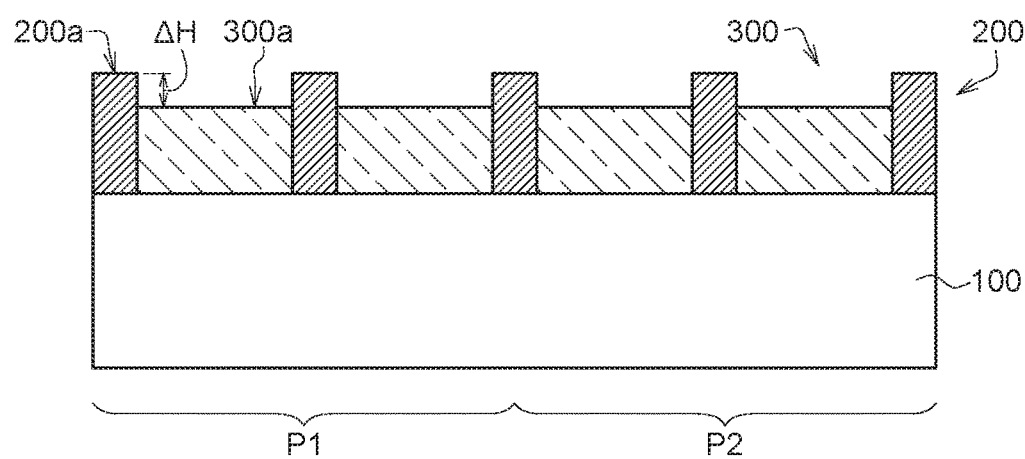

FIGS. 11A-11C show a manufacturing process of an image sensor (the image sensor 30 as shown in FIGS. 3A-3B) according to another embodiment of the present disclosure. The manufacturing process of the image sensor 30 as shown in FIGS. 3A-3B is different from the embodiment previously illustrated in FIG. 2A mainly in that the as-formed pixel isolation structure 200 has a different structure. In other words, a pattern which is predetermined according to the pixel isolation structure 200 of the image sensor 30 is applied to perform the patterning process of the pixel isolation structure 200.

Specifically speaking, as shown in FIG. 11A, a silicon substrate and a pixel sensing circuit 100 located thereon are provided. Next, as shown in FIG. 11B, a pixel isolation structure 200 is disposed on the pixel sensing circuit 100. The pixel isolation structure 200 defines multiple pixel regions, such as the pixel regions P1 and P2.

Next, as shown in FIG. 11C, an opto-electrical conversion layer 300 is formed on the pixel sensing circuit 100 by a coating process or a vapor deposition process. Due to the height difference ΔH between the top surface 200a and the top surface 300a, the as-formed opto-electrical conversion layer 300 could be naturally separated by the pixel isolation structure 200 and form multiple opto-electrical conversion portions, which are separated from one another, in multiple pixel regions; accordingly, issues of occurrence of crosstalk caused by the opto-electrical conversion portions of the opto-electrical conversion layer 300 in adjacent pixel regions could be prevented. As such, the manufacturing of the image sensor 30 as shown in FIG. 11A (FIGS. 3A-3B) is completed.

The manufacturing process of the image sensor 40 as shown in FIGS. 4A-4B is different from the previous embodiment as shown in FIGS. 3A-3B mainly in that the pixel isolation structure 200 has a different structure. In other words, a pattern which is predetermined according to the first electrode 210 and the second electrode 220 of the image sensor 40 is applied to perform the patterning process of the pixel isolation structure 200, followed by the formation of non-conductive layers 230 on the first electrode 210 and the second electrode 220.

Specifically speaking, in the present embodiment, the first electrode 210 and the second electrode 220 are formed on the pixel sensing circuit 100 by a single process, and then the non-conductive layers 230 are formed on the first electrode 210 and the second electrode 220, as shown in FIGS. 4A-4B.

The manufacturing process of the image sensor 50 as shown in FIG. 5 is different from the previous embodiment as shown in FIGS. 3A-3B mainly in the as-formed opto-electrical conversion layer 300. The coated or vapor-deposited opto-electrical conversion layer 300 of the present embodiment has a higher top surface 300a.

In addition, in the present embodiment, the connection via V1 and V2 may be formed on the pixel sensing circuit 100, and then the first electrode 210 and the second electrode 220 are formed on the connection via V1 and V2.

The manufacturing process of the image sensor 60 as shown in FIG. 6 is different from the previous embodiment as shown in FIG. 5 mainly in that the pixel isolation structure 200 has a different structure. In other words, a pattern which is predetermined according to the first electrode 210 and the second electrode 220 of the image sensor 60 is applied to perform the patterning process of the pixel isolation structure 200, followed by the formation of metal layers 250 on the first electrode 210 and the second electrode 220.

Specifically speaking, in the present embodiment, the first electrode 210, the second electrode 220, and the non-conductive layer 240 are formed on the pixel sensing circuit 100 by a single vapor deposition process, and then the metal layers 250 are formed on the non-conductive layer 240.

The manufacturing processes of the image sensors 70 and 80 as shown in FIGS. 7-8 are different from the previous embodiments mainly in that the first electrode 210 and the second electrode 220 have different structures. In other words, a pattern predetermined according to the first electrode 210 and the second electrode 220 of the image sensors 70 and 80 is applied to perform the patterning process of the pixel isolation structure 200.

The manufacturing process of the image sensor 90 as shown in FIG. 9 is different from the previous embodiments mainly in that the first electrode 210, the second electrode 220, and the non-conductive layers 230 have different structures. In other words, a pattern which is predetermined according to the first electrode 210 and the second electrode 220 of the image sensor 90 is applied to perform the patterning process of the pixel isolation structure 200, followed by the formation of non-conductive layers 230 on the first electrode 210 and the second electrode 220.

Figure 12:
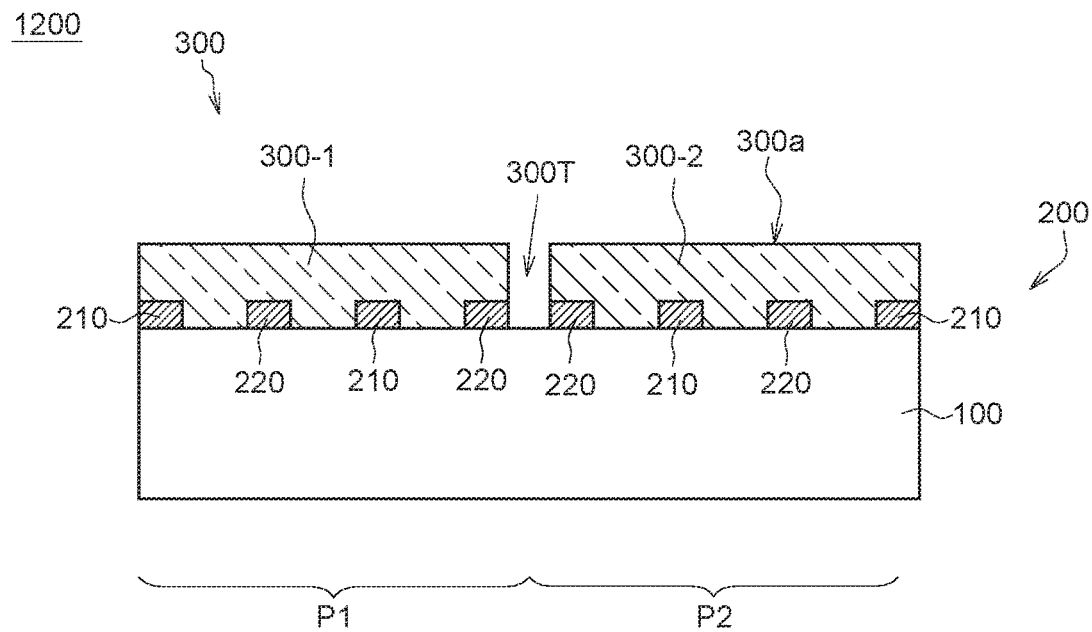
FIG. 12 shows a cross-sectional view of an image sensor according to a still further embodiment of the present disclosure.
Figure 12A:
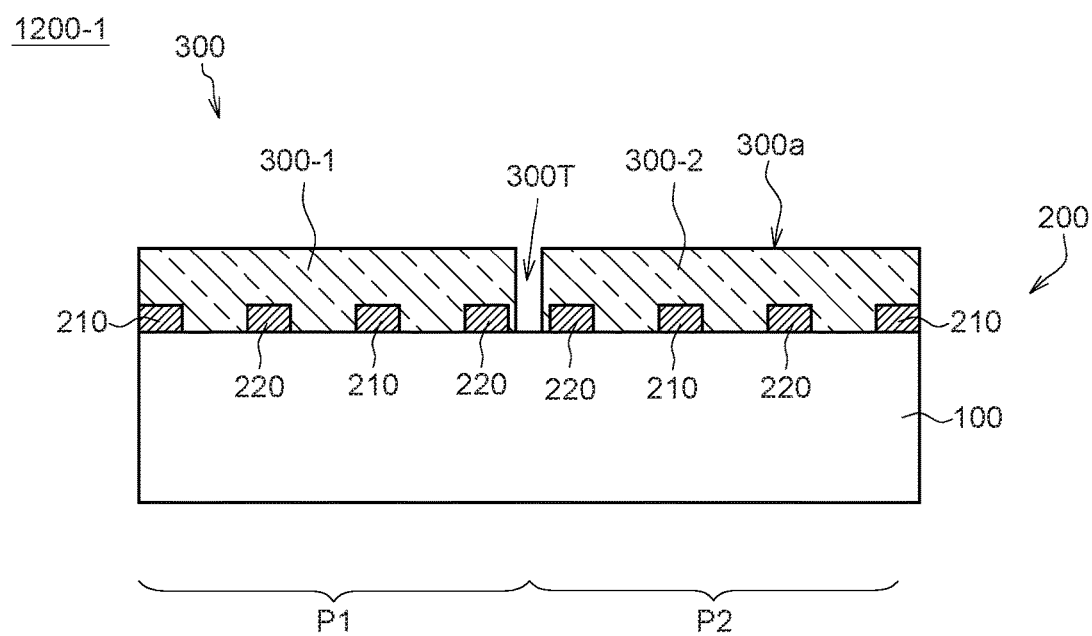
FIGS. 12A-12B show cross-sectional views of an image sensor according to a some further embodiments of the present disclosure.
Figure 12B:
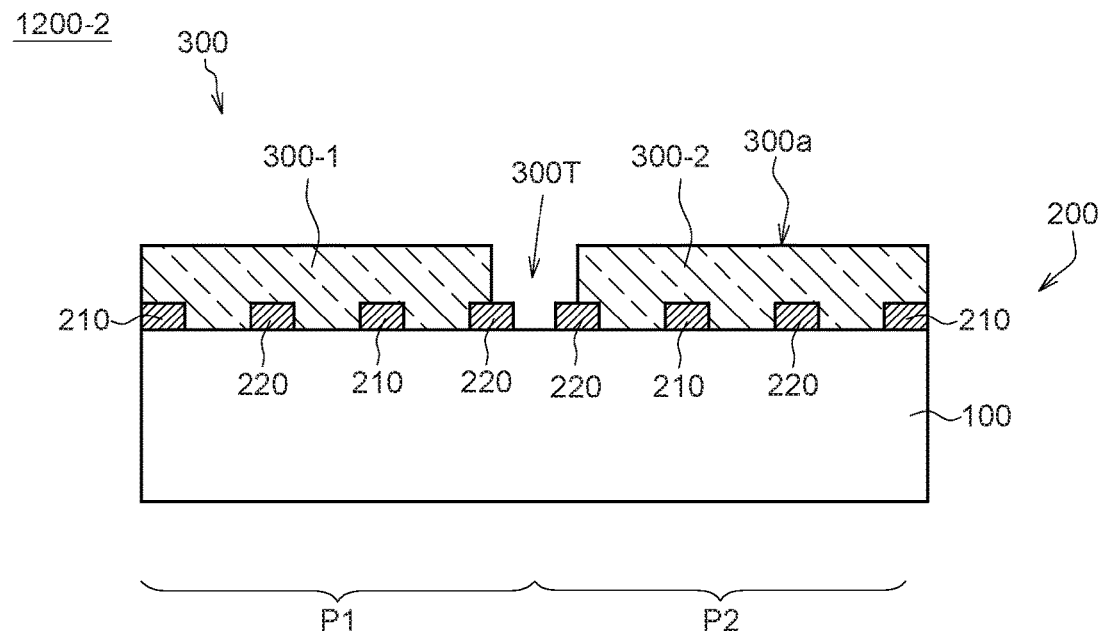

FIG. 12 shows a cross-sectional view of an image sensor according to a still further embodiment of the present disclosure, and FIGS. 12A-12B show cross-sectional views of an image sensor according to some further embodiments of the present disclosure. The elements in the present embodiment sharing the same or similar labels with those in the previous embodiments are the same or similar elements, and the description of which is omitted.

As shown in FIG. 12, the image sensor 1200 includes a pixel sensing circuit 100, a pixel electrode and an opto-electrical conversion layer 300. The pixel sensing circuit 100 is corresponding to a plurality of pixel regions, for example, the pixel regions P1 and P2. The pixel electrode is disposed on the pixel sensing circuit 100. The pixel electrode includes a first electrode 210 and a second electrode 220 and is electrically connected to the pixel sensing circuit 100. The first electrode 210 and the second electrode 220 are coplanar and have different polarities. The opto-electrical conversion layer 300 is disposed on the pixel sensing circuit 100, and the opto-electrical conversion layer 300 includes a plurality of opto-electrical conversion portions, for example, the opto-electrical conversion portions 300-1 and 300-2. Each of the opto-electrical conversion portion is respectively corresponding to each of the pixel regions, and the opto-electrical conversion portions are separated from each other by a pixel isolation trench 300T.

In the embodiment, each of the opto-electrical conversion portions is isolated within a pixel region by the pixel isolation trench 300T, such that the issues of crosstalk between opto-electrical conversion layer 300 (opto-electrical conversion portions) in adjacent pixel regions can be prevented. For example, the opto-electrical conversion portion 300-1 is corresponding to the pixel region P1, the opto-electrical conversion portion 300-2 is corresponding to the pixel region P2, and the opto-electrical conversion portion 300-1 and the opto-electrical conversion portion 300-2 are separated from each other by the pixel isolation trench 300T.

In the embodiment, as shown in FIG. 12, each of the opto-electrical conversion portions 300-1 and 300-2 are respectively located between the first electrode 210 and the second electrode 220 in each of the pixel regions P1 and P2. In the embodiment, as shown in FIG. 12, the top surface 300a of the opto-electrical conversion layer 300 is higher than a top surface of the pixel electrode 200.

In the embodiment, the opto-electrical conversion layer 300 may include a quantum dot material, a single crystal methyl ammonium lead iodide perovskite material, a poly crystal methyl ammonium lead iodide perovskite material, an amorphous methyl ammonium lead iodide perovskite material, or a single crystal, poly crystal, or amorphous methyl ammonium lead iodide chloride perovskite material, but not limited thereto.

In the embodiment as shown in FIG. 12, the sidewall of the pixel isolation trench 300T of the image sensor 1200 is substantially aligned with the sides of the first electrode 210 and the second electrode 220.

In the embodiment as shown in FIG. 12A, each of the opto-electrical conversion portions 300-1 and 300-2 covers the first electrode 210 and the second electrode 220 in each of the corresponding pixel regions P1 and P2.

In the embodiment as shown in FIG. 12B, the pixel isolation trench 300T exposes a portion of the first electrode 210 and a portion of the second electrode 220 of the image sensor 1200-2. For example, the opto-electrical conversion portions 300-1/300-2 corresponding to the pixel regions P1/P2 partially cover the first electrode 210 and the second electrode 220 for partially exposing the second electrode located at edges of the pixel regions P1/P2.

FIGS. 13A-13F show a manufacturing process of an image sensor (the image sensor 1200 as shown in FIG. 12) according to a still further embodiment of the present disclosure. Please refer to FIG. 12 and FIGS. 13A-13F for the description of the manufacturing process of an image sensor according to a still further embodiment of the present disclosure. The elements in the present embodiment sharing the same or similar labels with those in the previous embodiments are the same or similar elements, and the description of which is omitted.

Figure 13A:
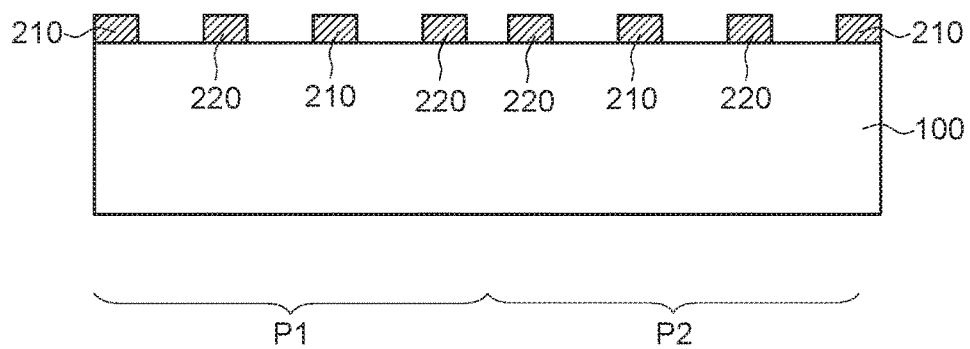
FIGS. 13A-13F show a manufacturing process of an image sensor according to a still further embodiment of the present disclosure.

As shown in FIG. 13A, a pixel sensing circuit 100 is provided, the pixel sensing circuit is corresponding to a plurality of pixel regions. Next, as shown in FIG. 13A, a pixel electrode is disposed on the pixel sensing circuit 100. As shown in FIG. 13A, the pixel electrode includes a first electrode 210 and a second electrode 220 and is electrically connected to the pixel sensing circuit. The first electrode 210 and the second electrode 220 are coplanar and have different polarities.

Next, as shown in FIGS. 13B-13F, an opto-electrical conversion layer 300 is disposed on the pixel sensing circuit. The opto-electrical conversion layer 300 includes a plurality of opto-electrical conversion portions, each opto-electrical conversion portions is corresponding to each of the pixel regions, and the opto-electrical conversion portions are separated from each other by a pixel isolation trench 300T. The manufacturing method of the opto-electrical conversion layer 300 includes such as the following steps.

Figure 13B:
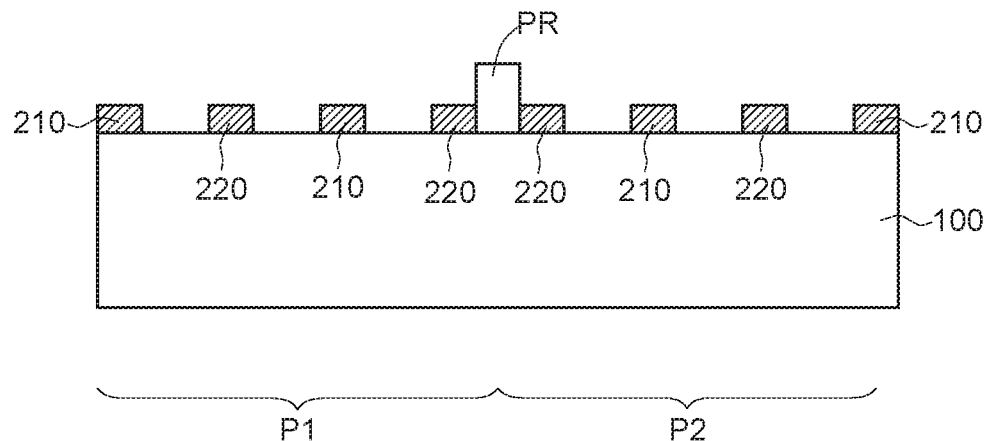

As shown in FIG. 13B, a patterned photoresist layer PR is formed on the pixel sensing circuit 100. In the embodiment, a pattern of the patterned photoresist layer PR is corresponding to an arrangement of the pixel regions.

Figure 13C:
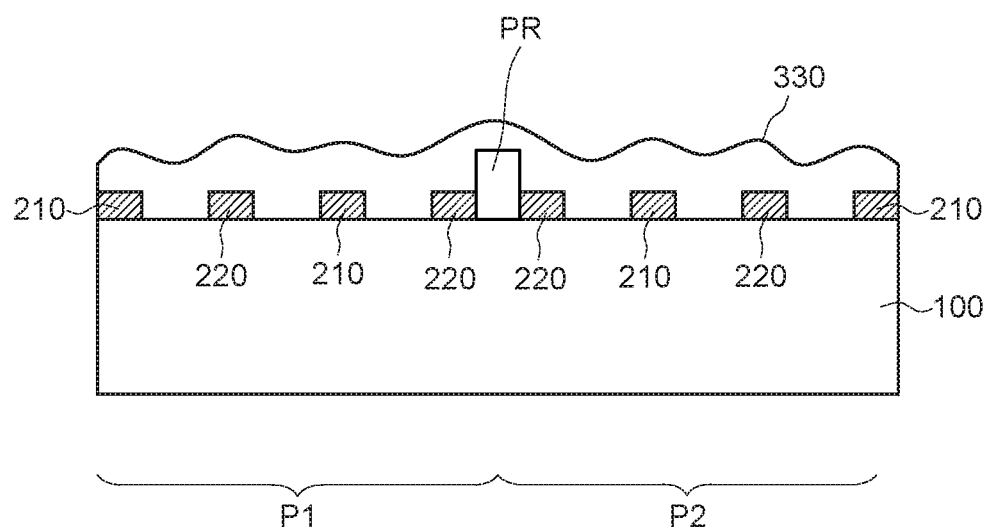

As shown in FIG. 13C, a first opto-electrical conversion precursor material 330 is formed on the structures of the first electrode 210, the second electrode 220 and the patterned photoresist layer PR. In the embodiment, the first opto-electrical conversion precursor material 330 is formed fully on the first electrode 210 and the second electrode 220 and covers the structures of the first electrode 210, the second electrode 220 and the patterned photoresist layer PR. In the embodiment, the first opto-electrical conversion precursor material 300 is such as an inorganic material. In one embodiment, the first opto-electrical conversion precursor material 300 is such as $PbI_2$.

Figure 13D:
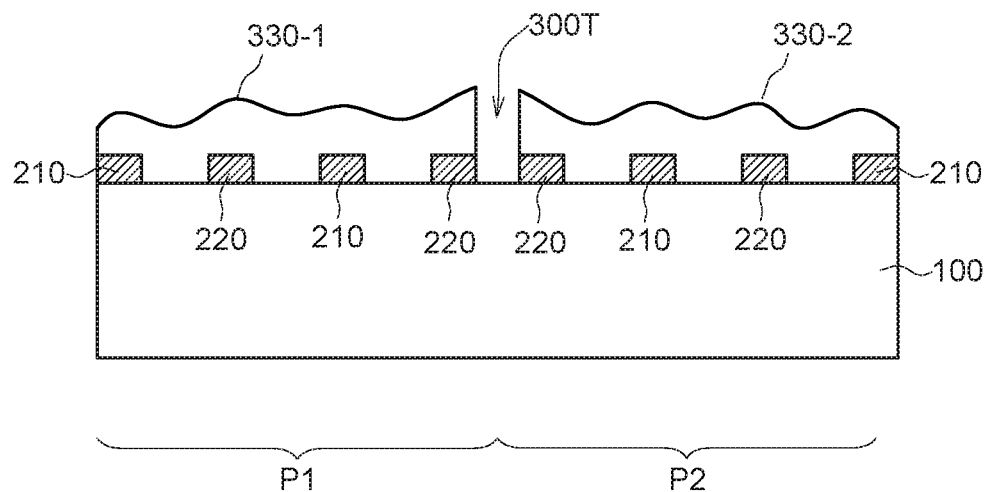

As shown in FIG. 13D, the first opto-electrical conversion precursor material 330 is partly removed for forming a plurality of first material portions, wherein each of the first material portions is corresponding to each of the pixel regions. For example, the first opto-electrical conversion precursor material 330 is partly removed for forming the first material portions 330-1 and 330-2, the first material portion 330-1 is corresponding to the pixel region P1, and the first material portion 330-2 is corresponding to the pixel region P2. In the embodiment, for example, a lift-off process may be performed to remove the patterned photoresist layer PR and the portions of the first opto-electrical conversion precursor material 330 located on the patterned photoresist layer PR.

Figure 13E:
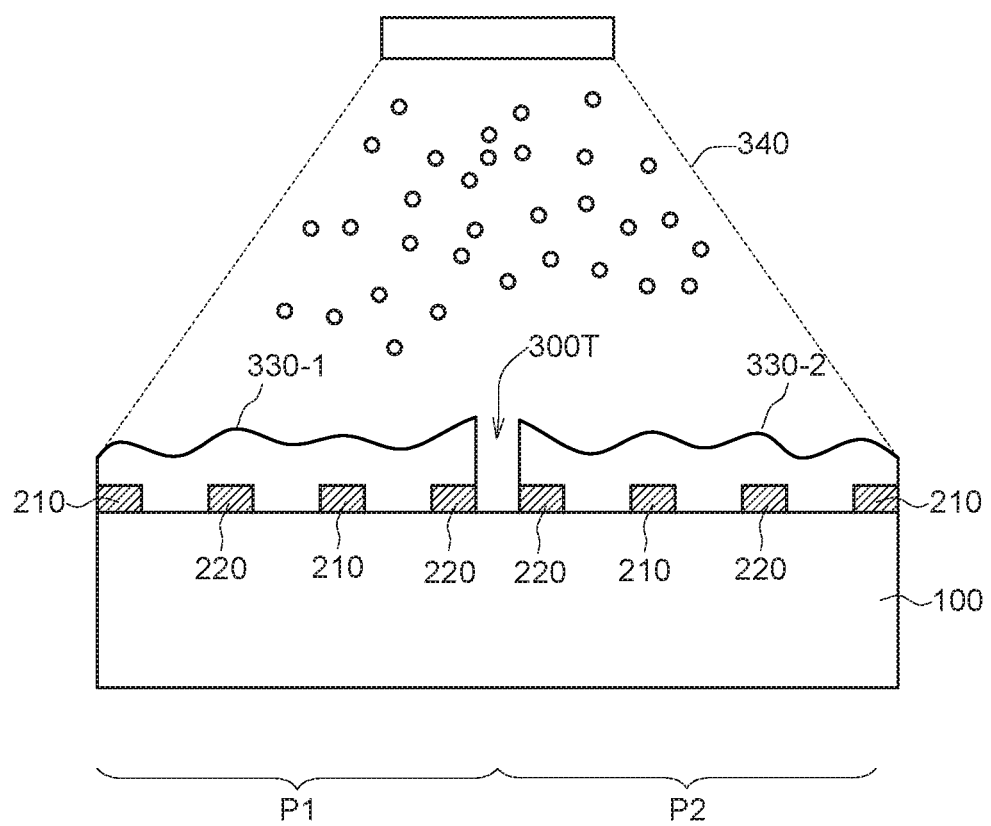

As shown in FIG. 13E, a second opto-electrical conversion precursor material 340 is provided to react with the first material portions. In the embodiment, the second opto-electrical conversion precursor material 340 is such as a gas compound. In one embodiment, the second opto-electrical conversion precursor material 340 is such as methyl ammonium iodide.

Figure 13F:
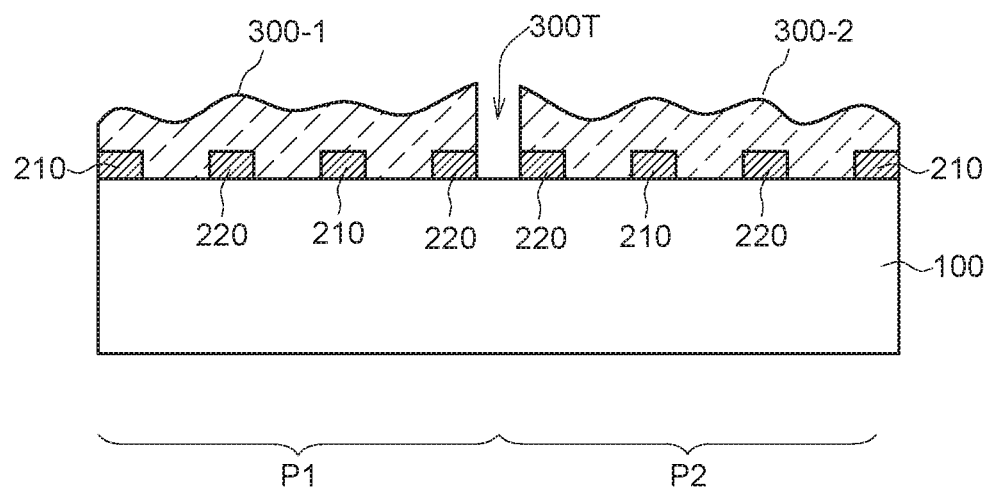

Next, as shown in FIG. 13F, the opto-electrical conversion layer 300 is formed by the reaction between the second opto-electrical conversion precursor material 340 and the first material portions. Since the second opto-electrical conversion precursor material 340 only reacts with the first opto-electrical conversion precursor material 330, thus the arrangements of the patterned first material portions can be maintained, such that the opto-electrical conversion layer 300 formed by the reaction between the second opto-electrical conversion precursor material 340 and the first material portions can have the predetermined pattern. The as-formed opto-electrical conversion layer 300 may include a quantum dot material, a single crystal methyl ammonium lead iodide perovskite material, a poly crystal methyl ammonium lead iodide perovskite material, an amorphous methyl ammonium lead iodide perovskite material, or a single crystal, poly crystal, or amorphous methyl ammonium lead iodide chloride perovskite material, but not limited thereto. Next, the image sensor 1200 as shown in FIG. 12 is formed.

It will be apparent to those skilled in the art that various modifications and variations can be made to the structure of the disclosed embodiments. It is intended that the specification and examples be considered as exemplary only, with a true scope of the disclosure being indicated by the following claims and their equivalents.

What is claimed is:

1. A manufacturing method of an image sensor, comprising:
   providing a pixel sensing circuit, the pixel sensing circuit corresponding to a plurality of pixel regions;
   disposing a pixel electrode on the pixel sensing circuit, the pixel electrode comprising a first electrode and a second electrode and electrically connected to the pixel sensing circuit, wherein the first electrode and the second electrode are coplanar and have different polarities; and
   disposing an opto-electrical conversion layer on the pixel sensing circuit, wherein the opto-electrical conversion layer comprises a plurality of opto-electrical conversion portions, each of the opto-electrical conversion portions corresponds to a respective one of the pixel regions, and the opto-electrical conversion portions are separated from each other by a pixel isolation trench,
   wherein disposing the opto-electrical conversion layer on the pixel sensing circuit comprises:
      forming a first opto-electrical conversion precursor material on the first electrode, the second electrode and a patterned photoresist layer;
      partly removing the first opto-electrical conversion precursor material for forming a plurality of first material portions, wherein each of the first material portions corresponds to a respective one of the pixel regions; and
      providing a second opto-electrical conversion precursor material to react with the first material portions for forming the opto-electrical conversion layer.

2. The manufacturing method of the image sensor according to claim 1, wherein partly removing the first opto-electrical conversion precursor material comprises;
   forming the patterned photoresist layer on the pixel sensing circuit, wherein the patterned photoresist layer is located between the pixel sensing circuit and the first opto-electrical conversion precursor material; and
   performing a lift-off process to remove the patterned photoresist layer and portions of the first opto-electrical conversion precursor material.

3. The manufacturing method of the image sensor according to claim 1, wherein the second opto-electrical conversion precursor material is a gas compound.

4. The manufacturing method of the image sensor according to claim 1, wherein the opto-electrical conversion layer comprises a quantum dot material, a single crystal methyl ammonium lead iodide perovskite material, a poly crystal methyl ammonium lead iodide perovskite material, an amorphous methyl ammonium lead iodide perovskite material, or a methyl ammonium lead iodide chloride perovskite material.

* * * * *